US010910473B2

(12) United States Patent
Park et al.

(10) Patent No.: US 10,910,473 B2
(45) Date of Patent: Feb. 2, 2021

(54) APPARATUSES WITH ATOMICALLY-THIN OHMIC EDGE CONTACTS BETWEEN TWO-DIMENSIONAL MATERIALS, METHODS OF MAKING SAME, AND DEVICES COMPRISING SAME

(71) Applicant: Cornell University, Ithaca, NY (US)

(72) Inventors: Jiwoong Park, Chicago, IL (US); Hui Gao, Brooklyn, NY (US); Marcos H. D. Guimaraes, Eindhoven (NL); Daniel C. Ralph, Ithaca, NY (US); Kibum Kang, Chicago, IL (US); Saien Xie, Chicago, IL (US)

(73) Assignee: Cornell University, Ithaca, NY (US)

( * ) Notice: Subject to any disclaimer, the term of this patent is extended or adjusted under 35 U.S.C. 154(b) by 0 days.

(21) Appl. No.: 16/309,637

(22) PCT Filed: Jun. 13, 2017

(86) PCT No.: PCT/US2017/037179
§ 371 (c)(1),
(2) Date: Dec. 13, 2018

(87) PCT Pub. No.: WO2017/218488
PCT Pub. Date: Dec. 21, 2017

(65) Prior Publication Data
US 2019/0165107 A1 May 30, 2019

Related U.S. Application Data

(60) Provisional application No. 62/349,193, filed on Jun. 13, 2016.

(51) Int. Cl.
*C23C 14/22* (2006.01)
*C23C 16/44* (2006.01)
(Continued)

(52) U.S. Cl.
CPC .......... *H01L 29/1606* (2013.01); *C23C 14/22* (2013.01); *C23C 16/305* (2013.01);
(Continued)

(58) Field of Classification Search
None
See application file for complete search history.

(56) References Cited

U.S. PATENT DOCUMENTS 8,906,787 B2   12/2014   Park et al.
9,595,580 B2    3/2017   Shin et al.
(Continued)

FOREIGN PATENT DOCUMENTS

| CN | 104022158 A | 9/2014 |
| CN | 105070347 A | 11/2015 |
| WO | 2014/178016 A2 | 11/2014 |

OTHER PUBLICATIONS

Kibum Kang et al. High-mobility three-atom-thick semiconducting films with wafer-scale homogeneity, Nature, vol. 520, Apr. 30, 2015, p. 656-660.*
(Continued)

*Primary Examiner* — Xiaoming Liu
(74) *Attorney, Agent, or Firm* — Hodgson Russ LLP

(57) ABSTRACT

Apparatuses comprising a substrate; a monolayer graphene film disposed on at least a portion of the substrate; and a single-layer transition metal dichalcogenide (TMD) disposed only on the substrate and lateral edges of the monolayer graphene film, methods of making the apparatuses, and devices comprising one or more of the apparatuses. The apparatuses have a one-dimensional ohmic edge contact between the monolayer graphene and monolayer semiconducting TMDs.

24 Claims, 18 Drawing Sheets

(51) Int. Cl.
| | |
|---|---|
| H01L 21/02 | (2006.01) |
| H01L 29/16 | (2006.01) |
| C23C 16/30 | (2006.01) |
| H01L 29/423 | (2006.01) |
| H01L 29/267 | (2006.01) |
| H01L 29/778 | (2006.01) |

(52) U.S. Cl.
CPC .......... *C23C 16/44* (2013.01); *H01L 21/0242* (2013.01); *H01L 21/0262* (2013.01); *H01L 21/02381* (2013.01); *H01L 21/02527* (2013.01); *H01L 21/02568* (2013.01); *H01L 29/267* (2013.01); *H01L 29/42364* (2013.01); *H01L 29/42376* (2013.01); *H01L 29/778* (2013.01)

(56) References Cited

U.S. PATENT DOCUMENTS

| | | | |
|---|---|---|---|
| 9,640,391 B2 | 5/2017 | Yang et al. | |
| 10,325,987 B2 | 6/2019 | Park et al. | |
| 2013/0287956 A1* | 10/2013 | Patil | B01J 37/34 427/333 |
| 2014/0197459 A1 | 7/2014 | Kis et al. | |
| 2015/0332920 A1 | 11/2015 | Shin et al. | |
| 2015/0364592 A1 | 12/2015 | van Dal et al. | |
| 2016/0016796 A1 | 1/2016 | Hersam et al. | |
| 2016/0093491 A1 | 3/2016 | Choi et al. | |
| 2016/0250712 A1* | 9/2016 | Cheng | B22F 1/0025 219/58 |
| 2017/0170260 A1* | 6/2017 | Dresselhaus | H01L 29/068 |

OTHER PUBLICATIONS

Allain, A., et al., Electrical contacts to two-dimensional semiconductors, Nature Materials, Dec. 2015, vol. 14, No. 12, pp. 1195-1205.

Geim, A.K., and Grigorieva, I.V., Van der Waals heterostructures, Nature Perspectives, Jul. 24, 2013, vol. 499, pp. 419-425.

Guimaraes, M.H.D., et al., Atomically-Thin Ohmic Edge Contacts Between Two-Dimensional Materials, ACS Nano, 2016, vol. , No. 6, pp. 6392-6399.

Guimaraes, M.H.D., et al., Atomically-Thin One-Dimensional Contacts to Two-Dimensional Semiconductors, APS March Meeting 2016, Mar. 1, 2016, 2 pages.

Sun, J., et al., First principles studies on electronic and transport properties of edge contact graphene-MoS2 heterostructure, Computational Materials Science, Jun. 1, 2017, vol. 133, pp. 137-144.

Tang, H., et al., Interpenetrated Graphene/WSe2 Lateral Heterostructures for Barrierless Ohmic-Contacted p-FETs, ECS Meeting Abstracts, May 31, 2016, 2 pages.

Hong. W., Lateral Heterostructure of Graphene and MoS2 for Performance Enhancement of MoS2 FET, Graphene 2017, Mar. 31, 2017, 1 page.

Zheng, C., et al., Direct Observation of 2D Electrostatics and Ohmic Contacts in Template-Grown Graphene/WS2 Heterostructures, ACS Nano, 2017, Feb. 21, 2017, vol. 11, No. 3, pp. 2785-2793.

Chen, W., Properties of In-Plane Graphene/MoS2 Heterojunctions, Harvard University, Cambridge MA, Apr. 9, 2017, 20 pages.

Liu, Y., et al., Toward Barrier Free Contact to Molybdenum Disulfide Using Graphene Electrodes, Nano Letters, Apr. 16, 2015, vol. 15, No. 5, pp. 3030-3034.

Ling, X., et al., Parallel Stitching of Two-Dimensional Materials, Advanced Materials, Dec. 14, 2015, 30 pages.

* cited by examiner

APPARATUSES WITH ATOMICALLY-THIN OHMIC EDGE CONTACTS BETWEEN TWO-DIMENSIONAL MATERIALS, METHODS OF MAKING SAME, AND DEVICES COMPRISING SAME

CROSS REFERENCE TO RELATED APPLICATIONS

This application claims priority to U.S. Provisional Application No. 62/349,193, filed on Jun. 13, 2016, the disclosure of which is hereby incorporated by reference.

STATEMENT REGARDING FEDERALLY-SPONSORED RESEARCH OR DEVELOPMENT

This invention was made with government support under contract FA2386-13-1-4118 awarded by the Air Force Office of Scientific Research and under contract DMR-1120296 awarded by the National Science Foundation. The government has certain rights in the invention.

BACKGROUND OF THE DISCLOSURE

With the decrease of the dimensions of electronic devices, the role played by electrical contacts is ever increasing, eventually coming to dominate the overall device volume and total resistance. This is especially problematic for monolayers of semiconducting transition metal dichalcogenides (TMDs), which are promising candidates for atomically thin electronics. Improved electrical contacts for them would require the use of similarly thin electrode materials while maintaining low contact resistances.

Even though monolayer two-dimensional (2D) materials such as graphene and transition metal dichalcogenides (TMDs) show promising results towards atomically-thin circuitry, the contact volume and resistance often dominate over the total device volume and resistance. There are two different contact interface geometries for 2D materials: top contacts and edge contacts (FIG. 1a). Conventional methods use 3D metallic electrodes to top-contact monolayer 2D materials. Recent developments have shown that low contact resistance is achievable in this configuration, but the total electrode volume is an intrinsic problem for this approach. Graphene top-contacts can provide much smaller volumes with low contact resistances when they have sufficiently large contact areas. However, due to the van der Waals gap between graphene and the TMD, the contact resistance increases dramatically as the length of the graphene top contact is reduced below the transfer length to the tens of nm scale.

Edge contacts, on the other hand, offer the potential for efficient carrier injection to atomically thin materials despite a much smaller contact area defined by their atomic thickness. Conventional metal electrodes have been successfully used to make edge contacts to graphene, but the large electrodes still dominate the device volume. Another approach, which alters the crystalline phase of a 2D TMD semiconductor to make it metallic, generates an edge contact to the TMD with small contact volume and resistance. However, it relies on a phase that is metastable, and it uses methods that are customized for the specific chemical composition of the TMD.

To realize the full potential of atomically-thin TMD materials for electronics may require contacts with a low intrinsic volume that are scalable with low contact resistances, chemically and thermally stable, and versatile towards use with different TMD materials.

BRIEF SUMMARY OF THE DISCLOSURE

In an aspect, the present disclosure provides apparatuses. The apparatuses have ohmic edge contact (e.g., a one-dimensional ohmic edge contact) between a monolayer graphene and a monolayer semiconducting TMD. In an example, an apparatus comprises: a substrate; a monolayer graphene film disposed on at least a portion of the substrate; and a single-layer transition metal dichalcogenide (TMD) disposed only on the substrate and lateral edges of the monolayer graphene film.

In an aspect, the present disclosure provides methods. The methods can be used to make an apparatus of the present disclosure. In an example, a method comprises: forming a monolayer graphene film on a substrate; and forming a single-layer transition metal dichalcogenide (TMD) on the substrate that contacts one or more of the lateral edges of the monolayer graphene film or growing a single-layer transition metal dichalcogenide (TMD) on the substrate from lateral edges of the monolayer graphene film, where the single-layer TMD is in contact with the substrate and only contacts the monolayer graphene film at the lateral edges (e.g., not on a top surface of the graphene film disposed opposite a surface of the substrate in contact with the monolayer graphene film).

In an aspect, the present disclosure provides devices. The devices comprise one or more apparatus of the present disclosure methods can be used to make an apparatus of the present disclosure. In an example, a device is an optically-transparent electronic device. The device comprises one or more apparatus of the present disclosure.

DESCRIPTION OF THE DRAWINGS

For a fuller understanding of the nature and objects of the disclosure, reference should be made to the following detailed description taken in conjunction with the accompanying drawings, in which.

DETAILED DESCRIPTION OF THE DISCLOSURE

Figure 1:
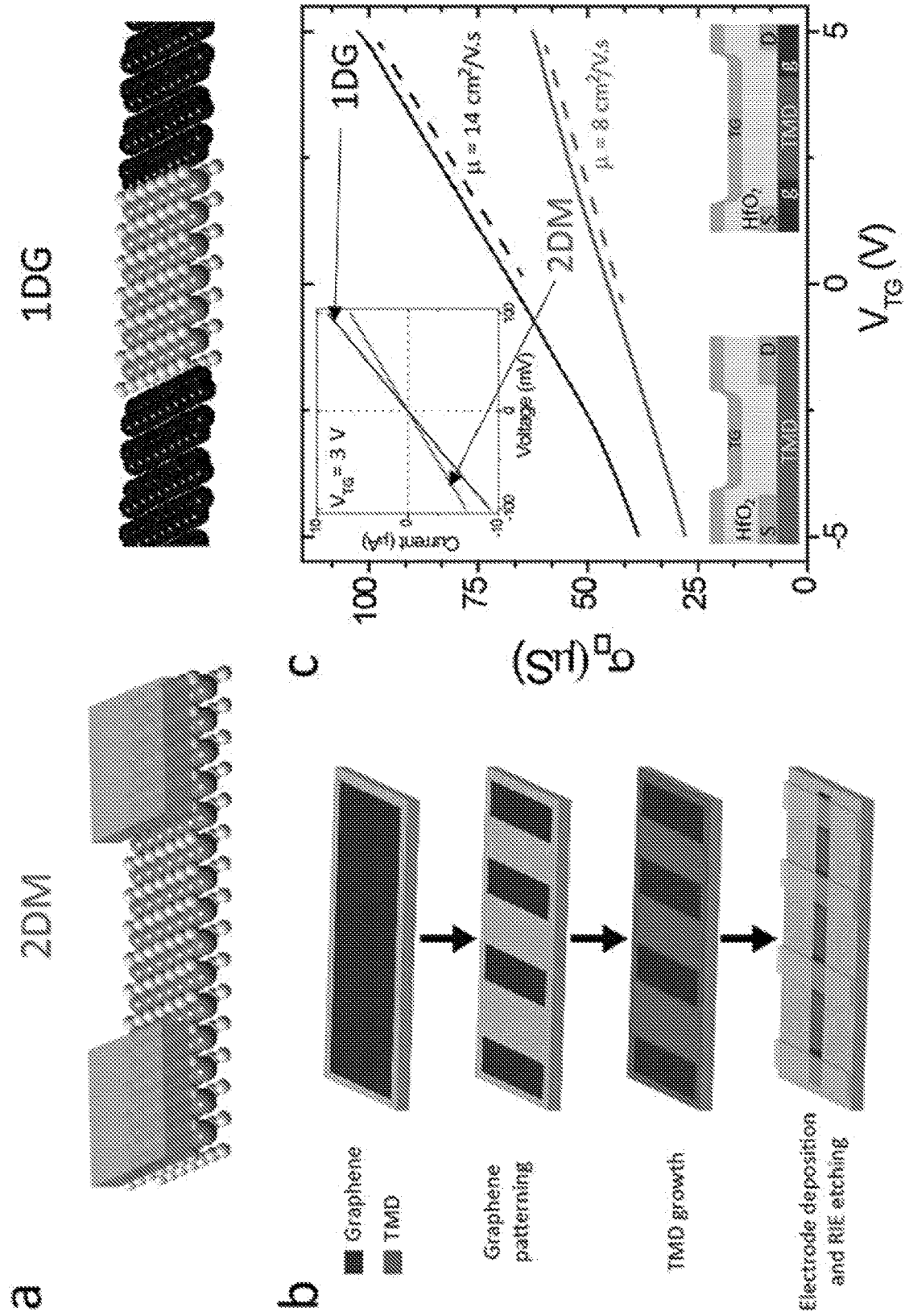
FIG. 1. Schematic illustration of metal top (2DM) contacts (left) and graphene edge (1DG) contacts (right) for TMD devices (a). The large-scale growth and fabrication process for producing TMD transistor arrays with 1DG edge contacts (b). Top gate voltage ($V_{TG}$) dependence of the two-terminal sheet conductance ($\sigma_\square$) measured from $MoS_2$ devices (length 22 µm and width 20 µm) with 1DG contacts and with 2DM electrodes (contact dimensions 23 µm×22 µm×55 nm) (c). Top inset: IV characteristics for the two devices at $V_{TG}$=3 V. Bottom insets: Cross-sectional device schematics for the devices with 2DM (left) and 1DG (right) contacts, showing the TMD channel, the graphene contacts (g), and the source (S), drain (D) and top gate (TG) electrodes with the insulating $HfO_2$ layer.

Although claimed subject matter will be described in terms of certain embodiments, other embodiments, including embodiments that do not provide all of the benefits and features set forth herein, are also within the scope of this disclosure. Various structural, logical, process step, and electronic changes may be made without departing from the scope of the disclosure.

The present disclosure provides apparatuses with atomically-thin ohmic edge contacts between two-dimensional materials. The disclosure also provides methods of making the apparatuses, and devices comprising one or more of the apparatuses.

The present disclosure provides a scalable method to fabricate ohmic graphene edge contacts between monolayer TMDs (e.g., to two representative monolayer TMDs—$MoS_2$ and $WS_2$). Laterally-stitched graphene/TMD heterostructures were fabricated using a scalable and patternable growth method with homogeneous quality over the entire substrate. For example, a graphene and TMD layer are laterally connected with wafer-scale homogeneity, no observable overlap or gap, and a low average contact resistance of 30 k$\Omega\mu$m. The resulting graphene edge contacts show linear current-voltage (IV) characteristics at room temperature, with ohmic behavior maintained down to liquid helium temperatures (e.g., −269° C.).

In an aspect, the present disclosure provides apparatuses. The apparatuses have ohmic edge contact (e.g., a one-dimensional ohmic edge contact) between a monolayer graphene and a monolayer semiconducting TMD.

In various examples, an apparatus comprises, consists, or consists essentially of: a substrate; a monolayer graphene film disposed on at least a portion of the substrate; and a single-layer transition metal dichalcogenide (TMD) disposed only on the substrate and lateral edges of the monolayer graphene film. In an example, the TMD layer is not a multilayer TMD layer. In another example, the TMD layer does not comprise any multilayer TMD regions.

The monolayer graphene film single-layer (monolayer) transition metal dichalcogenide (TMD) are laterally stitched. By "laterally stitched" is it meant that there is no visible gap or overlap between the two materials. For example, there is no visible gap or overlap between the two materials at a resolution 20 nm or below.

Various substrates can be used. In various examples, the substrate or substrate surface comprises or consists of at least one of $Al_2O_3$, $SiO_2$, silicon (Si), or other metal or metalloid oxide(s).

A single-layer TMD can include one or more transition metal sulfides and/or one or more transition metal selenides and/or transition metal tellurides. In various examples, a single-layer TMD comprises at least one of $MoS_2$, $WS_2$, $MoSe_2$, $WSe_2$, $MoTe_2$, $WTe_2$, $NbSe_2$, or a combination thereof, An apparatus can have desirable properties. In various examples, an apparatus has one or more of the following properties:
  the monolayer graphene layer/monolayer TMD layer has a contact resistance (e.g., an average contact resistance) of 30 k$\Omega\mu$m or less;
  the monolayer graphene layer and TMD layer are laterally connected with wafer-scale homogeneity (e.g., all of the monolayer graphene layer and TMD layers in an area of 1 square inch or greater or 5 square inches or greater are laterally connected);
  there is no observable overlap and/or gap between the monolayer graphene layer and TMD layer; or
  the graphene edge contact show linear current-voltage (IV) characteristics at room temperature, with ohmic behavior maintained down to liquid helium temperatures.
In an example, an apparatus has all of these properties.

In an example, no van der Waals gap or tunnel barrier exists between the monolayer graphene film and the single-layer TMD. In an example, the monolayer graphene film and the single-layer TMD form a homogenous heterostructure. The monolayer graphene film and the single-layer TMD do not form a vertical heterostructure. The monolayer graphene film and the single-layer TMD do not form a contact resulting from interdigitation of graphene and TMD.

In an example, a junction is formed between the monolayer graphene film and the single-layer TMD. In an example, the TMD layer is a monolayer thick across the entire junction between the monolayer graphene film (one atom thick) and the single-layer TMD (three atoms thick).

In an example, a substrate comprises a plurality of heterostructures as described herein (e.g., junctions between (formed from) monolayer graphene layers and single-layer TMDs). In an example, a plurality of apparatuses are disposed on a substrate and greater than 95%, greater than 97%, or greater than 99% or all of the apparatuses on the substrate exhibit one or more of the structural features and/or properties described herein. In an example, a plurality of apparatuses are disposed on a substrate and greater than 95%, greater than 97%, or greater than 99% or all of the apparatuses on 1 square inch or 5 square inches of the substrate exhibit one or more of the structural features and/or properties described herein.

In various examples, the graphene monolayer/TMD interface exhibits an electrical contact resistance (resistivity of a 1D contact) of 30 kOhms-micrometer or less, 20 kOhms-micrometer or less, 15 kOhms-micrometer or less, or 10 kOhms-micrometer or less. In various other examples, the graphene monolayer/TMD interface exhibits an electrical resistance (resistivity of a 1D contact) of 50-10 kOhms-micrometer, 40-10 kOhms-micrometer, 30-10 kOhms-micrometer. Contact resistance (resistivity of a 1D contact) equals Rc*W, where Rc is the contact resistance and W the contact width.

In an aspect, the present disclosure provides methods. The methods can be used to make an apparatus of the present disclosure. The methods are based on use of controllable methods of growth of a single layer TMD only of the exposed surface of the substrate and not on the graphene.

In an example, a method comprises: providing a monolayer graphene film on a substrate or forming a monolayer graphene film on a substrate; and forming a single-layer transition metal dichalcogenide (TMD) on the substrate that contacts one or more of the lateral edges of the monolayer graphene film (e.g., growing a single-layer transition metal dichalcogenide (TMD) on the substrate from lateral edges of the monolayer graphene film), where the single-layer TMD is in contact with the substrate and only contacts the monolayer graphene film at the lateral edges (e.g., not on a top surface of the graphene film disposed opposite a surface of the substrate in contact with the monolayer graphene film).

The monolayer graphene film can be formed by various methods. In an example, the monolayer graphene film is formed by chemical vapor deposition on the substrate. In another example, the monolayer graphene film is formed by chemical vapor deposition and is transferred to the substrate. The graphene film can be configured to be used as one-dimensional edge contacts to the single-layer TMD. In an example, a method further comprises patterning the monolayer graphene film prior to forming (e.g., growing) the single-layer TMD.

A single-layer TMD can be formed (e.g., grown) by metal-organic chemical vapor deposition or molecular beam epitaxy. The single-layer TMD can be formed (e.g., grown) using gaseous metal organic precursors (e.g., transition metal carbonyls such as, for example, $Mo(CO)_6$ and/or $W(CO)_6$, and the like) and gaseous organic sulfides such as, for example, dimethyl sulfide and the like and/or organic selenides such as, for example, dimethyl selenide and the like. The TMD layer is continuous (no observable gaps or hole defects), uniform (no thickness variation), and exhibits mechanical continuity. It is desirable that the method used to form the single layer TMD be controllable. By controllable it is meant that there is no TMD nucleation on the graphene or formation of multilayer TMD regions. Without intending to be bound by any particular theory, it is considered that selection of a particular partial pressure of TMD precursor(s) (e.g., transition metal carbonyl compound(s) and/or organic sulfide and/or organic selenide) provides a reactive environment that provides a controllable method and desired TMD monolayer. In an example, the single-layer TMD is grown using metal-organic chemical vapor deposition at a $P_M$ (partial pressure of transition metal precursor) below 0.7 mTorr (e.g., from 0.01 mTorr to 0.7 mTorr).

The monolayer graphene and single layer TMD film can be formed (e.g., grown) under various conditions. In an example, the monolayer graphene film and/or the single-layer TMD are formed (e.g., grown) at room temperature.

The substrate is as described herein. The single-layer TMD is as described herein.

A method can comprise additional steps. In an example, a method further comprises forming electrodes on the monolayer graphene film and/or the single-layer TMD. In an example, a method further comprises depositing an insulating material (e.g., a metal oxide such as, for example, $HfO_2$) on at least one of the single layer TMD or the monolayer graphene film to form a top gate electrode.

The steps of the method described in the various embodiments and examples disclosed herein are sufficient to produce the apparatuses and devices of the present disclosure. Thus, in an example, a method consists essentially of a combination of the steps of the methods disclosed herein. In another example, a method consists of such steps.

In an aspect, the present disclosure provides devices. The devices comprise one or more apparatus of the present disclosure. In an example, a device is an optically-transparent electronic device (e.g., a field-effect transistor with ohmic contacts). The device comprises one or more apparatus of the present disclosure. The junction(s) of the apparatus or apparatuses can be used as a contact to any devices where the TMD is the active element including but not limited to PN junctions, PIN junctions, inverters, rectifiers, logic gates, and the like.

The following Statements provide examples of apparatuses, methods, and devices of the present disclosure:

Statement 1. An apparatus comprising: a substrate; a monolayer graphene film disposed on at least a portion of the substrate (e.g., disposed on a least a portion of an exterior surface of the substrate); and a single-layer transition metal dichalcogenide (TMD) disposed only on the substrate and lateral edges of the monolayer graphene film.

Statement 2. An apparatus according to Statement 1, where the substrate is a substrate disclosed herein (e.g., a substrate that includes (e.g., comprises, consists of, or has at least one surface comprising or consisting of) at least one of $Al_2O_3$, $SiO_2$, Si, or other metal or metalloid oxide).

Statement 3. An apparatus according to any one of Statements 1-2, where the TMD layer is a TMD layer disclosed herein (e.g., a single-layer TMD that includes (e.g., comprises or consists of) at least one of $MoS_2$, $WS_2$, $MoSe_2$, $WSe_2$, $MoTe_2$, $WTe_2$, $NbSe_2$, or a combination thereof).

Statement 4. An apparatus according to any one of Statements 1-3, where the monolayer graphene film (e.g., interface/contact between the monolayer graphene film and TMD) has a contact resistance (resistivity) of 30 kΩμm or less, 20 kΩμm or less, 10 kΩμm or less, or 50-10 kΩμm, 40-10 kΩμm, or 30-10 kΩμm.

Statement 5. An apparatus according to any one of Statements 1-4, where no van der Waals gap or tunnel barrier exists between the monolayer graphene film and the single-layer TMD.

Statement 6. An apparatus according to any one of Statements 1-5, where the monolayer graphene film and the single-layer TMD form a homogenous heterostructure.

Statement 7. An apparatus according to any one of Statements 1-6, where a junction is formed between the monolayer graphene film and a single-layer TMD.

Statement 8. A method comprising: forming a monolayer graphene film on a substrate; and forming a single-layer transition metal dichalcogenide (TMD) on the substrate from lateral edges of the monolayer graphene film (e.g., growing a single-layer transition metal dichalcogenide (TMD) on the substrate from lateral edges of the monolayer graphene film), where the single-layer TMD is in contact with the substrate and only contacts the monolayer graphene film at the lateral edges (e.g., not on a top surface of the graphene film disposed opposite a surface of the substrate in contact with the monolayer graphene film).

Statement 9. A method according to Statement 8, where the monolayer graphene film is formed by chemical vapor deposition on the substrate.

Statement 10. A method according to Statement 8, where the monolayer graphene film is formed by chemical vapor deposition and is transferred to the substrate.

Statement 11. A method according to any one of Statements 8-10, where the single-layer TMD is grown by metal-organic chemical vapor deposition or molecular beam epitaxy.

Statement 12. A method according to Statement 11, where the single-layer TMD is grown (e.g., a single layer molybdenum sulfide, molybdenum selenide, or molybdenum telluride film is grown using $Mo(CO)_6$ or a single layer tungsten sulfide, tungsten selenide, or tungsten telluride film is grown using $Wo(CO)_6$ by metal-organic chemical vapor deposition at a $P_M$ below 0.7 mTorr (e.g., from 0.01 mTorr to 0.7 mTorr).

Statement 13. A method according to any one of Statements 8-12, further comprising fabricating a device, where the graphene film is configured to be used as one-dimensional edge contacts to the single-layer TMD.

Statement 14. A method according to any one of Statements 8-13, where the monolayer graphene film and/or the single-layer TMD are grown at room temperature (e.g., 18-25° C.).

Statement 15. A method according to any one of Statements 8-14, where the substrate includes at least one of $Al_2O_3$, $SiO_2$, Si, or other metal or metalloid oxide(s).

Statement 16. A method according to any one of Statements 8-15, where the single-layer TMD includes at least one of $MoS_2$, $WS_2$, $MoSe_2$, $WSe_2$, $MoTe_2$, $WTe_2$, $NbSe_2$, or a combination thereof.

Statement 17. A method according to any one of Statements 8-16, further comprising patterning the monolayer graphene film (e.g., using a photolithographic process and oxygen plasma etching) prior to growing the single-layer TMD.

Statement 18. A method according to any one of Statements 8-17, further comprising forming electrodes on the monolayer graphene film and/or the single-layer TMD.

Statement 19. A method according to Statement 18, further comprising depositing an insulating (e.g., electrically insulating) material (e.g., a metal oxide such as, for example, HfO$_2$) and a top electrode on at least one of the single layer TMD or the monolayer graphene film to form a top gate electrode.

Statement 20. A device (e.g., an optically-transparent electronic device) comprising one or more apparatus of any one of Statements 1-7 or one or more apparatus made by a method of any one of Statements 8-18.

The following examples are presented to illustrate the present disclosure. They are not intended to limiting in any matter.

EXAMPLE 1

This example provides a description of examples of apparatuses and methods of the present disclosure.

Described in this example is the fabrication of one-dimensional ohmic edge contacts between monolayer graphene and monolayer semiconducting TMDs using a scalable method. The TMDs can be, for example, MoS$_2$, WS$_2$, MoSe$_2$, WSe$_2$, MoTe$_2$, WTe$_2$, NbSe$_2$, other similar materials, and combinations thereof. These contacts possess low resistance while maintaining minimal electrode volume and contact area. Our technique for making edge contacts to semiconducting TMDs provides a versatile, stable, and scalable method for forming low-volume, low-resistance contacts for atomically-thin circuitry, which could be attractive for flexible and optically transparent electronics.

FIG. 1b summarizes an embodiment of the approach disclosed herein. A monolayer graphene film, grown by chemical vapor deposition (CVD) is transferred onto a SiO$_2$/Si substrate and patterned by photolithography and oxygen plasma etching. To make lateral connections between the graphene and a TMD, a highly controllable Metal-Organic CVD (MOCVD) method for the growth of single layer TMDs (e.g., MoS$_2$ or WS$_2$) from the graphene edges is used, causing the ensuing TMD growth to occur only on the exposed SiO$_2$ surface and not on the graphene. The resulting heterostructure film is then further processed to fabricate an array of devices that use graphene as one-dimensional edge contacts to the TMD channels. While a SiO$_2$/Si substrate is shown, the substrate can be other materials, such as Al$_2$O$_3$ or other oxides. Other techniques besides CVD can be used to form the graphene film. While MOCVD provides a controllable environment that enables control of the TMD nucleation rate, other controllable formation techniques, such as molecular beam epitaxy (MBE) also can be used.

In FIG. 1c we plot the gate-dependent 2-probe conductance of a representative MoS$_2$ device (22 μm long) contacted by graphene electrodes (20 μm wide) and we compare it to the results from a device with conventional metal top (2DM) contacts with dimensions 23 μm×22 μm×55 nm. All results shown here and discussed below were obtained at room temperature and ambient conditions, unless otherwise noted. Both sets of contacts show ohmic behavior (see inset).

Surprisingly, the graphene electrodes show a lower contact resistance despite drastic reduction in the electrode volume and, as we confirm below, the contact area. This results in a higher 2-probe conductance, and therefore also an enhanced 2-probe field-effect mobility for the devices with 1DG contacts (FIG. 1c; main panel). The improved contact resistance of the graphene electrodes implies that there is a strong connection between the graphene and TMD edges, suggesting a lack of a van der Waals gap or tunnel barrier as previously observed in 2DM contacts or overlapped graphene top contacts. We note that the 2-probe mobility obtained using 1DG contacts ranges from 10 to 30 cm$^2$/Vs.

Figure 2:
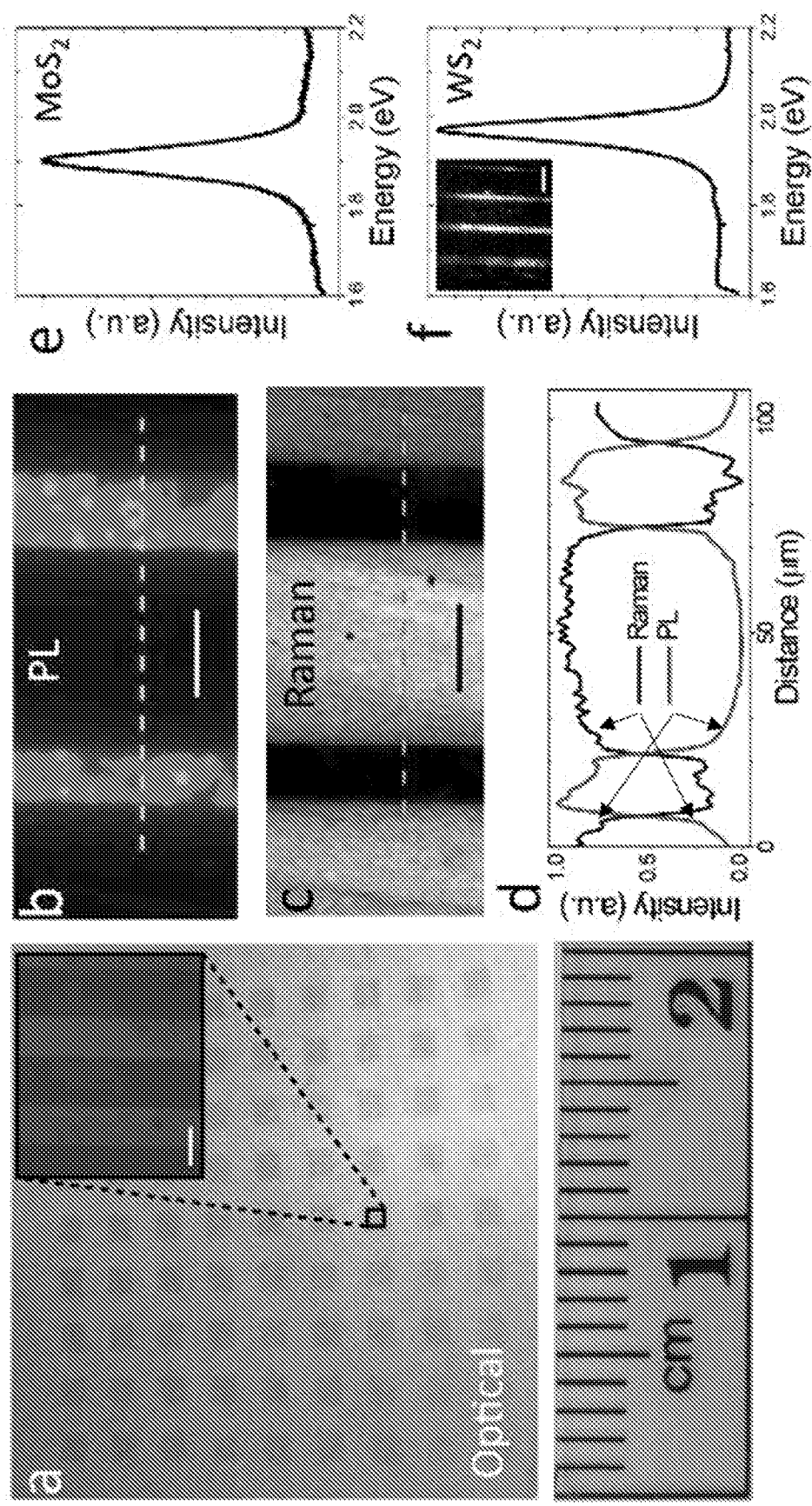
FIG. 2. Optical image of a typical growth substrate over a 2 cm×2 cm area (a). Each dark grey square contains 20 graphene stripes connected by a monolayer $MoS_2$ film. Inset: Optical image showing monolayer $MoS_2$ (darker) grown between graphene stripes (lighter). The scale bar is 15 µm. $MoS_2$ photoluminescence (PL) intensity mapping centered at 650 nm (b) and graphene G-band Raman mapping (c). The scale bars are 25 µm. (d) PL and Raman intensity profiles extracted along the dashed line as indicated in (b) and (c). PL spectrum for (e) $MoS_2$ and (f) $WS_2$. Inset: $WS_2$ PL intensity mapping. The scale bar is 50 µm.

The growth and fabrication process described above results in lateral TMD/graphene heterostructures with uniform properties over large areas. An optical micrograph of the heterostructure film over centimeter scales is shown in FIG. 2a. We observe homogeneous graphene/MoS$_2$ heterostructures over the entire substrate with no visible overlap or multilayer regions in the optical contrast (see the zoomed-in image in the inset, FIG. 2a). The monolayer homogeneity and spatial controllability are further confirmed by the MoS$_2$ photoluminescence (PL; FIG. 2b) and graphene G-band Raman mapping (FIG. 2c). The PL and Raman intensity profiles extracted along the dashed lines of FIGS. 2b and 2c show abrupt transitions within the optical resolution (approximately 1 μm) between the two materials (FIG. 2d) demonstrating excellent compatibility with large area patterning with precise spatial control. The TMD layer show good optical properties as demonstrated by the sharp peaks in their PL spectra, similar to the ones obtained in exfoliated flakes (FIGS. 2e and 2f).

Figure 3:
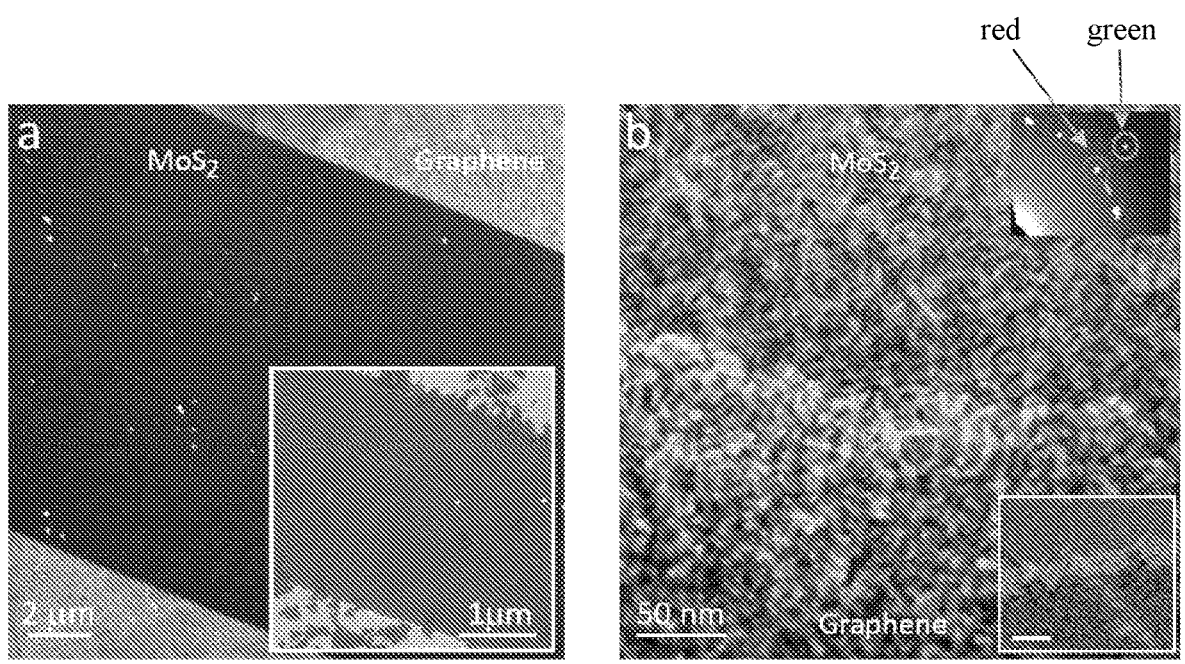
FIG. 3. Scanning Electron Microscopy (SEM) image of a graphene/MoS$_2$/graphene lateral junction grown under a low Mo precursor pressure (a). Inset: SEM image of a junction grown under high Mo precursor pressure. The presence of few-layer MoS$_2$ flakes (dark triangles) on the graphene and on the monolayer MoS$_2$ film indicate a more reactive growth environment. A dark-field transmission electron microscopy (DF-TEM) image of the lateral junction formed between graphene and MoS$_2$, grown under a low Mo precursor pressure (b). The upper inset shows the diffraction spots used for the graphene area (green) and MoS$_2$ (red). Lower inset: A representative DF-TEM image of an overlapped junction obtained under non-optimal (high precursor pressure) growth conditions. The scale bar is 50 nm.

The nucleation behavior of the TMD is dependent on the partial pressure (P$_M$) of the transition metal precursor (e.g., Mo(CO)$_6$ for MoS$_2$ and W(CO)$_6$ for WS$_2$) during the growth. A scanning electron microscopy (SEM) image of a representative sample grown under desirable conditions, with P$_M$ below 0.7 mTorr, is shown in FIG. 3a (main panel) where we observe no MoS$_2$ nucleation on graphene nor the formation of multilayer MoS$_2$ regions in our TMD film. On the other hand, when the growth is performed under a more reactive environment (higher P$_M$), we observe multilayer MoS$_2$ regions on both the graphene and the MoS$_2$ film (FIG. 3a, inset). As shown below, the nucleation behavior of the TMD has a direct impact on the lateral stitching of the graphene and the TMD.

Figure 4:
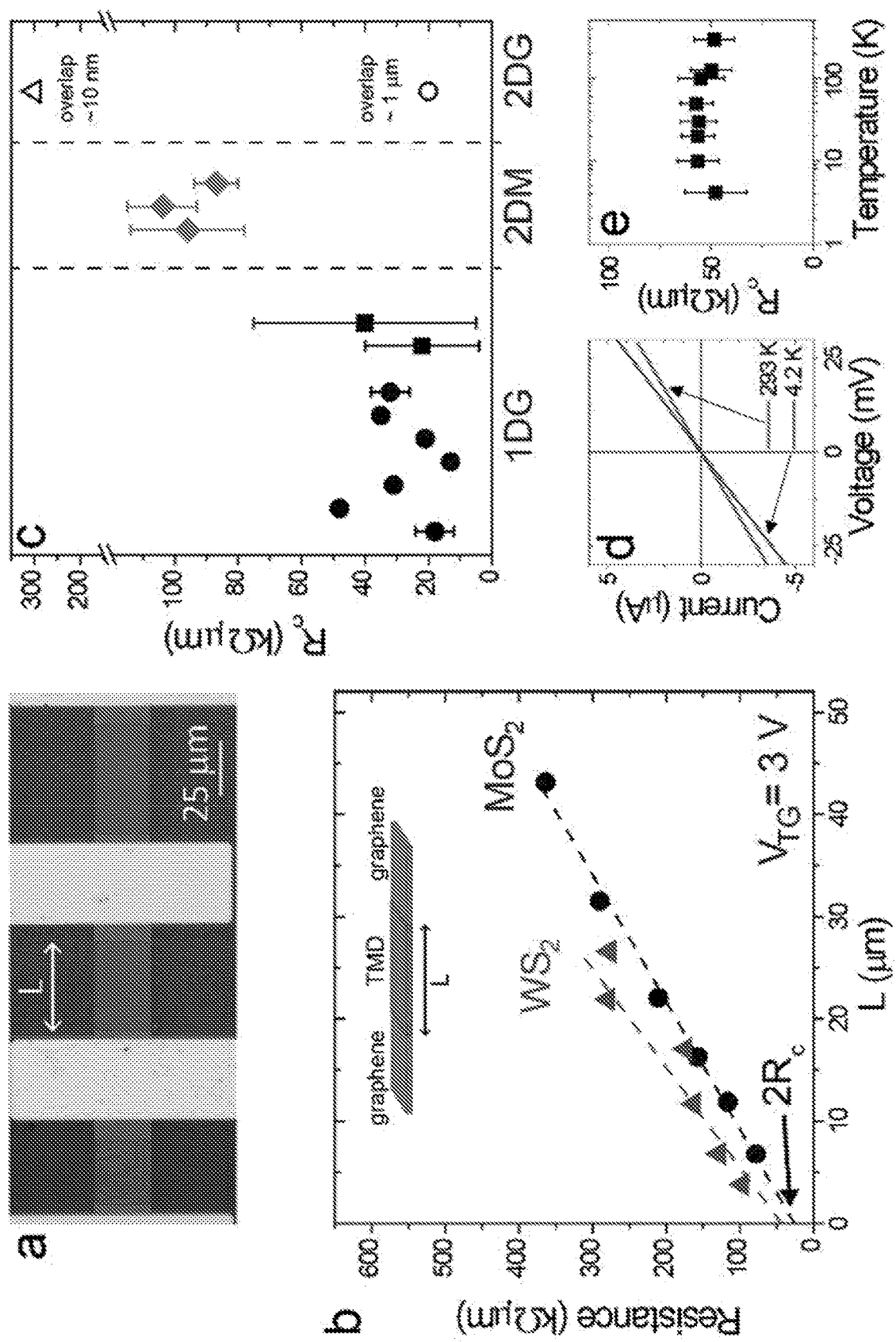
FIG. 4. Optical micrograph of the device geometry used in the transfer length measurements (a), where L is the MoS$_2$ channel length. 2-probe resistance as a function of L for MoS$_2$ (circles) and WS$_2$ (triangles) with 1DG contacts (b). They-intercept of the linear fits gives 2R$_c$ and the slope gives the sheet resistance. R$_c$ values for different devices at high carrier density (c). The solid circles (solid squares) represent our MoS$_2$ (WS$_2$) based devices with 1DG contacts. The diamonds represent R$_c$ for our 2DM contacts MoS$_2$. Devices with 2DG contacts are denoted by the open triangle and open circle, respectively. (d) Source-drain current versus voltage at 293 K and 4.2 K for a MoS$_2$ based device with 1DG contacts at $V_{TG}$=3 V (n~1×10$^{13}$ cm$^{-2}$). (e) R$_c$ as a function of temperature for the same device in (d).

The lateral connection between the graphene and the TMD can be probed by dark-field electron microscopy (DF-TEM). FIG. 3b shows a representative DF-TEM image of a graphene/MoS$_2$ junction grown under desirable conditions, showing no overlap region between the graphene and MoS$_2$ within the imaging resolution (below 10 nm). The selected diffraction spots are shown on the upper right inset. The lateral connection between graphene and MoS$_2$ is observed consistently over different regions of the substrate. A representative example of an overlapped graphene/MoS$_2$ junction, grown under high P$_M$ (above 1 mTorr), is shown in the inset of FIG. 3b. Its overlapped structure is similar to the ones that were recently reported, which displayed much higher contact resistance (approximately 300 kΩμm) than our laterally-stitched 1DG contacts (see FIG. 4c for a more quantitative comparison). The sharpness of our junctions is further confirmed by electron energy loss spectroscopy (EELS) analysis.

The formation of the lateral connection between graphene and MoS$_2$ (or WS$_2$) only at low P$_M$, is consistent with the layer-by-layer growth mode where the nucleation and growth was limited to the SiO$_2$ growth surface until a fully continuous monolayer was formed. On the other hand, multilayer regions were found to form if the precursor concentration was higher. We found that the TMD only nucleates on the SiO$_2$ surface including at the graphene edges at lower P$_M$, and the TMD grains grow on the SiO$_2$ surface until they meet and laterally connect to form a homogeneous layer. In contrast, with higher P$_M$, the TMD nucleates also on the graphene surface, leading to multilayer formation and regions of overlapped graphene/TMD junctions (see inset of FIG. 3a). Our results thus strongly suggest that the precise control of all the precursor pressures, which is a key feature of our MOCVD approach, is central to the fabrication of laterally connected edge-contacts between graphene and TMDs.

We performed quantitative determinations of contact resistances using the analog of Transfer Length Measurements (TLMs), based on the 2-probe resistance of TMD channels measured with varying length and fixed width (see FIG. 4a for an optical image of a device). The total 2-probe resistance is $$R = 2R_c + \left(\frac{\rho_{TMD}}{W}\right)L,$$

where $\rho_{TMD}$ is the TMD resistivity, and W and L are the TMD channel width and length respectively. In this analysis we ignore the contact resistance between graphene and the metal contact. However, we note that this contribution can become relevant if the contact area between the metal electrode and graphene is reduced. FIG. 4b shows the measured dependence of R on L for two devices with 1DG contacts to $MoS_2$ (circles) and $WS_2$ (triangles) channels. These measurements were taken at a top gate voltage of $V_{TG}=3$ V, corresponding to a carrier density of $n\sim1\times10^{13}$ $cm^{-2}$, estimated from the threshold voltage and the gate capacitance. The $R_c$ values are obtained by extrapolating to zero TMD length, which are similarly low for the 1DG contacts to both $MoS_2$ and $WS_2$, on the order of 20 kΩμm. This suggests that our method is versatile towards its use with different TMDs.

The one-dimensional graphene edge contacts show consistently low contact resistances with good reproducibility. In FIG. 4c we plot our results for $R_c$ obtained by TLM measurements for seven $MoS_2$ (solid circles) and two $WS_2$ based devices (solid squares) with 1DG contacts, obtained from five different growth runs on different substrates. The values for $R_c$, measured at a carrier density of $n\sim1\times10^{13}$ $cm^{-2}$, remain similar throughout different samples, with the median $R_c$ of 30 kΩμm. For a direct comparison, we fabricated three $MoS_2$ based devices using Ti/Au metal electrodes, which are widely used to contact TMD materials, next to some of the devices with 1DG contacts. These devices with 2DM contacts show higher contact resistance values ($R_c\sim95$ kΩμm; denoted by solid diamonds, FIG. 4c) at similar carrier densities that are consistent with previously reported results. These results confirm that our graphene electrodes provide low resistance edge contacts to TMDs despite the minimal electrode volume with $R_c$ values that are smaller than those of conventional Ti/Au 2DM contacts but are larger than the smallest values recently reported from pure metal electrodes. Here we restrict our comparison to contacts to monolayer TMDs only, since $R_c$ is known to increase with the decrease in layer number.

FIG. 4c presents additional comparison with graphene top (2DG) contacts, which have achieved similarly low contact resistances in the order of $R_c\sim20$ kΩμm while reducing significantly the electrode volume when compared to 2DM contacts (open circle in FIG. 4c). However, when the overlap area between the graphene top contact and $MoS_2$ is reduced, the devices show an increase in contact resistance ($R_c\sim300$ kΩμm; open triangle in FIG. 4c) and display nonlinear IV characteristics at room temperature, showing that 2DG contacts may not be suitable for small scale devices. Likewise, $R_c$ in devices with 2DM contacts is known to increase exponentially when the contact length is decreased below the transfer length ($L_T\sim15$-600 nm), which limits the minimum device footprint. On the other hand, our 1DG contacts should not be bound by such limitations, since it uses the edge contact geometry. Furthermore, temperature dependent electrical measurements confirm the ohmic nature of the graphene edge contacts to $MoS_2$: our $MoS_2$ devices with 1DG contacts show linear IV characteristics with little temperature dependence from room temperature down to liquid helium temperatures (FIG. 4d), and we observe no temperature dependence for $R_c$, extracted from TLM, over the same temperature range (FIG. 4e). Altogether, these results suggest that 1DG contacts provide a novel route for reducing the overall device size while maintaining low-resistance ohmic contacts.

Figure 5:
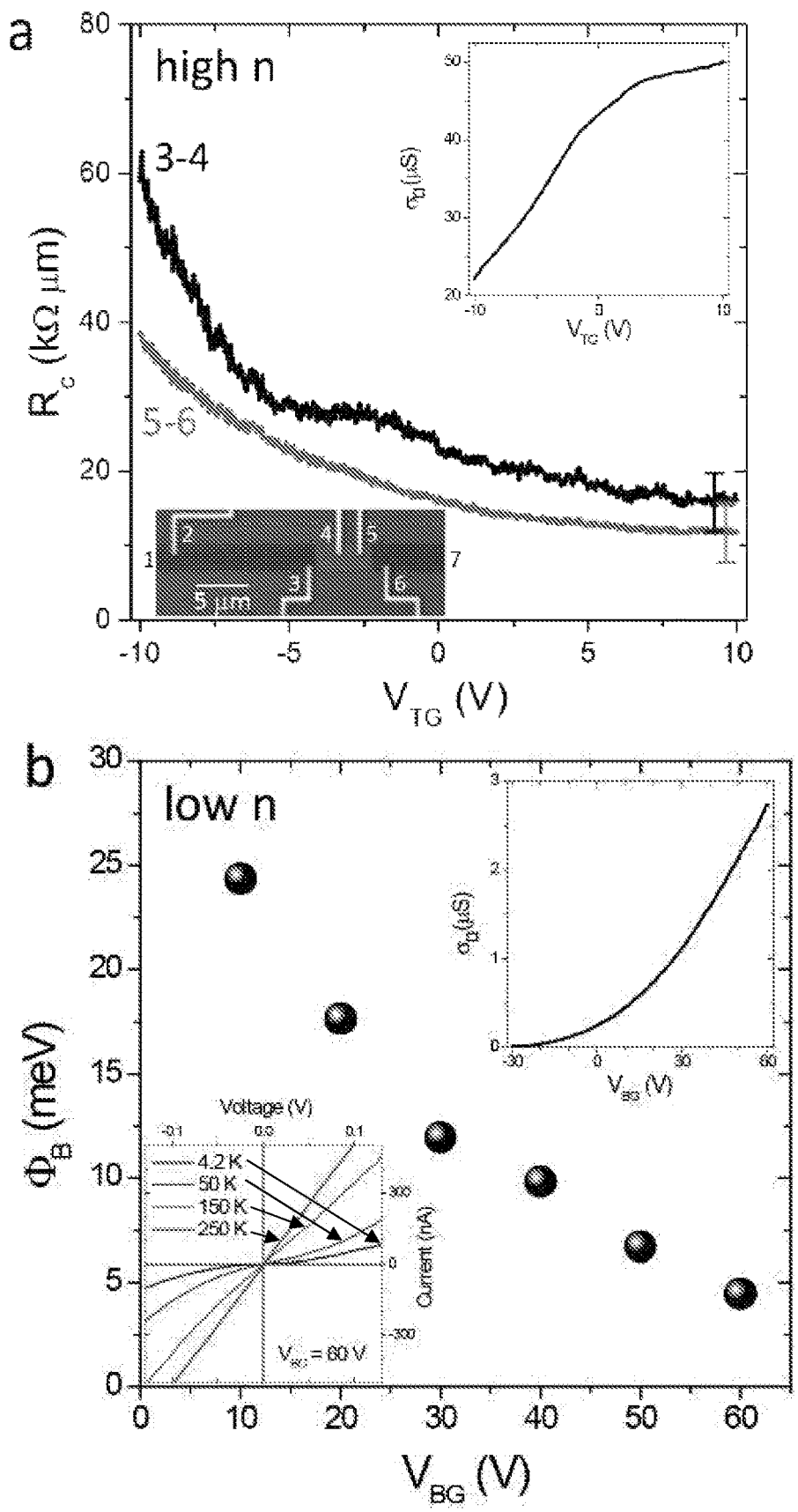
FIG. 5. Contact resistance R$_c$ as a function of the top gate voltage ($V_{TG}$) for two adjacent junctions at high carrier densities (n>1×10$^{13}$ cm$^{-2}$) (a). A false color optical micrograph indicating the electrode numbering is shown in the bottom inset. Current is applied between contacts 1 and 7 and the contact resistances of two different graphene/MoS$_2$ interfaces are measured by reading out the voltage between electrodes 3 and 4 and between electrodes 5 and 6. The contributions from the graphene (between electrodes 2 and 3) and MoS$_2$ (between electrodes 4 and 5) resistances have been subtracted as discussed in the text. Top inset: MoS$_2$ sheet conductance measured between electrodes 4 and 5 as a function of $V_{TG}$. (b) shows barrier height ($\Phi_B$) as a function of back gate voltage ($V_{BG}$) extracted from the temperature dependence of the junction resistance for a device at low carrier densities (n<3×10$^{12}$ cm$^{-2}$). Top inset: MoS$_2$ sheet conductance as a function of $V_{BG}$. Bottom inset: IV characteristics measured at different temperatures for a single graphene/MoS$_2$ junction in a 4-probe geometry for $V_{BG}$=60 V showing nonlinear characteristics due to tunneling below 150 K.

For doping-dependent studies, we have performed direct measurements of $R_c$ using a gated 4-probe geometry for junctions in devices with smaller dimensions (FIG. 5a, bottom inset). For the 4-probe measurements, we subtract the contribution of the resistance from the sheet resistance of the $MoS_2$ and graphene, measured independently. FIG. 5a shows $R_c$, measured as a function of $V_{TG}$ for the left (denoted 3-4) and right (5-6) 1DG contacts to $MoS_2$. They are similar, illustrating the homogeneity of the junctions. The $R_c$ values at high carrier density are consistent with the ones extracted using TLM measurements in larger devices, confirming that $R_c$ is independent of contact width, over at least one order of magnitude scaling in the width. When the $MoS_2$ carrier density decreases, the 4-probe measurements show an increase in $R_c$, as is usual for contacts to 2D semiconductors.

We have explored the properties of the 1DG contacts at lower carrier densities using additional 4-probe $MoS_2$-based devices controlled using the Si back gate (with no top gate electrode) and similar dimensions as the one shown in FIG. 5a, bottom inset. At low carrier densities ($n<3\times10^{12}$ $cm^{-2}$), where the high resistance of the $MoS_2$ channel itself (above 1 MΩ per square; FIG. 5b, upper inset) dominates the total resistance, the I-V characteristics show a linear behavior at room temperature. Only at lower temperatures below 150 K, is there any nonlinearity indicative of an interface barrier (FIG. 5b, lower inset). From Arrhenius plots we extract the barrier height ($\Phi_B$) as a function of the back gate voltage ($V_{BG}$) as shown in FIG. 5b, main panel. We observe $\Phi_B$ 4 meV at $V_{BG}=60$ V and $\Phi_B$ 24 meV at $V_{BG}=10$ V.

Figure 6:
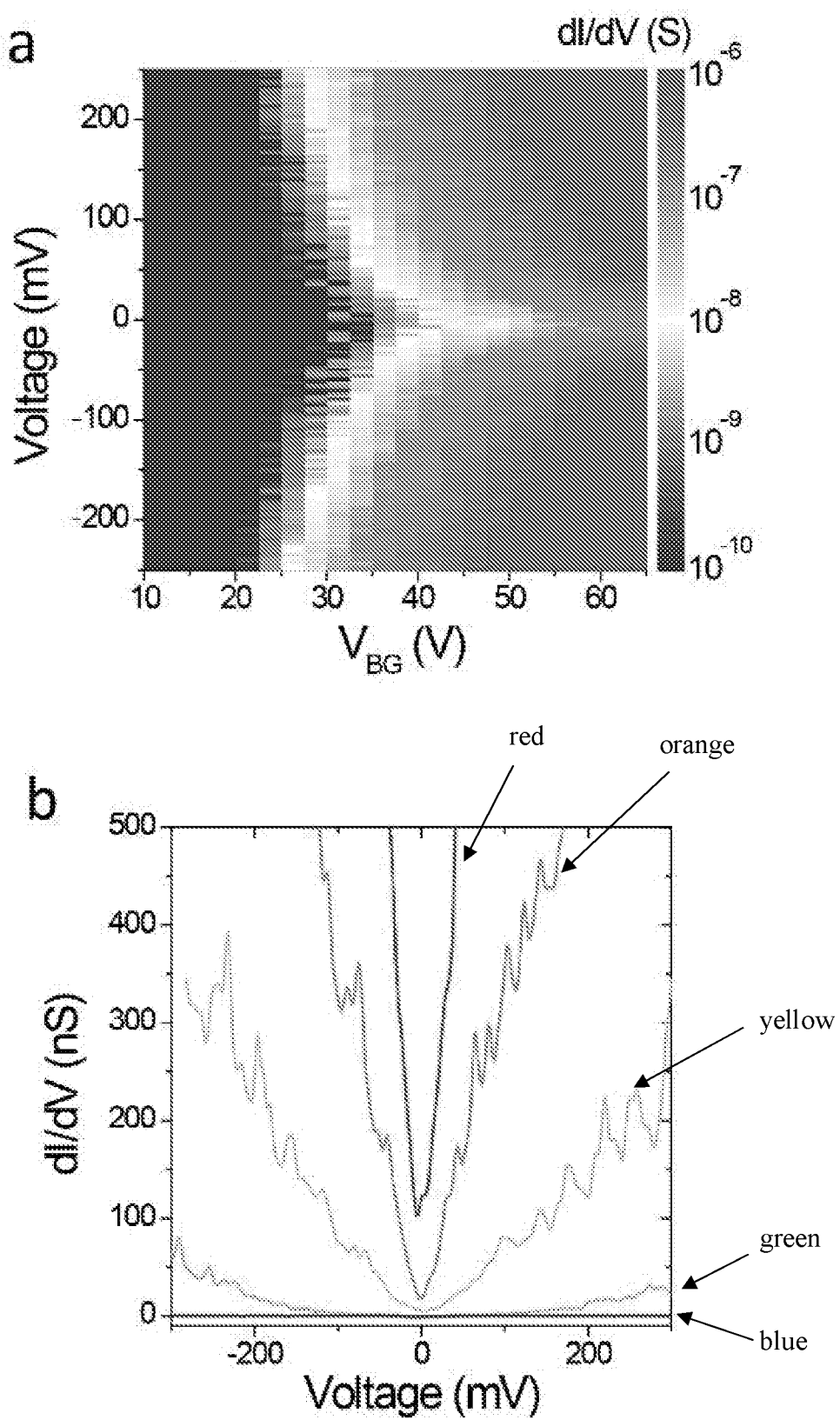
FIG. 6. Differential conductance (dI/dV; log scale) as a function of the back gate voltage ($V_{BG}$) and the source-drain voltage measured across the junction in a 4-probe geometry at low temperature (4.2 K) is shown in (a) for the same device as in FIG. 5b. (b) shows dI/dV as a function of the junction voltage for different values of $V_{BG}$=20, 30, 40, 50, and 60 V (from bottom to top (blue, green, yellow, orange, and red, respectively).

The small value of $\Phi_B$ in our devices is further confirmed by the existence of linear I-V characteristics at different values of $V_{BG}$ at room temperature and additional measurements of the differential conductance at liquid helium temperatures. In FIG. 6a we plot the differential conductance for the same device in FIG. 5b as a function of $V_{BG}$ and the source-drain voltage across the junction measured in a 4-probe geometry ($V_1$). These measurements were performed at a temperature of T=4.2 K, equivalent to a thermal energy of $3k_BT\sim1$ meV, where $k_B$ is the Boltzmann constant. The fast decrease of the barrier height with increasing $V_{BG}$ is shown by the rapid shrinking of the low differential conductance region, as represented by the white region (dI/dV=$10^{-8}$ S) in FIG. 6a. The sizeable zero-bias differential conductance for $V_{BG}>40$ V (FIG. 6b) is consistent with a barrier height in the same order as the thermal energy (approximately 1 meV). Both the decrease of $\Phi_B$ with $V_{BG}$ and its value around 1 meV at high $V_{BG}$ obtained by our differential conductance measurements are consistent with the thermal-activation (Arrhenius) measurements shown in FIG. 5b.

Our $\Phi_B$ values are smaller than the values obtained for overlapped graphene junctions at similar carrier densities, $\Phi_B$~20-100 meV. The small $\Phi_B$ values in our 1DG contacts are consistent with the low-resistance ohmic behavior discussed in FIG. 4, and can be explained by the lack of a van der Waals gap in our edge contact geometry.

Heterostructure growth. Graphene grown by chemical vapor deposition (CVD) on copper is wet-transferred to a $SiO_2$/Si substrate and then patterned using photolithography and oxygen plasma etching. The TMD growth is done using the metal-organic CVD method with Molybdenum hexacarbonyl ($Mo(CO)_6$, MHC, Sigma Aldrich 577766), tungsten hexacarbonyl ($W(CO)_6$, THC, Sigma Aldrich 472956) and diethyl sulfide ($C_4H_{10}S$, DES, Sigma Aldrich 107247) as the chemical precursors for Mo, W, and S respectively. The growth was performed under a temperature of 500° C. and growth time of 30 hours. The precursor vapor pressures are controlled by careful heating of the precursor source and the flow is controlled by mass-flow controllers with settings: 0.01 sccm for MHC or THC, 0.3 sccm for DES, 1 sccm for Hz, and 150 sccm for Ar.

Device preparation. After the graphene/TMD lateral heterostructures are grown, a series of lithography steps followed by high-vacuum metal deposition are used to define Ti/Au (5/50 nm thick) electrodes either on the graphene or directly onto the TMD layer. Finally, on some devices, high quality $HfO_2$ (30 to 60 nm) is deposited by atomic layer deposition followed by another lithography and metal deposition step to define the top gate (TG) electrodes.

1: Additional Information on the Heterostructure Growth

Figure 7:
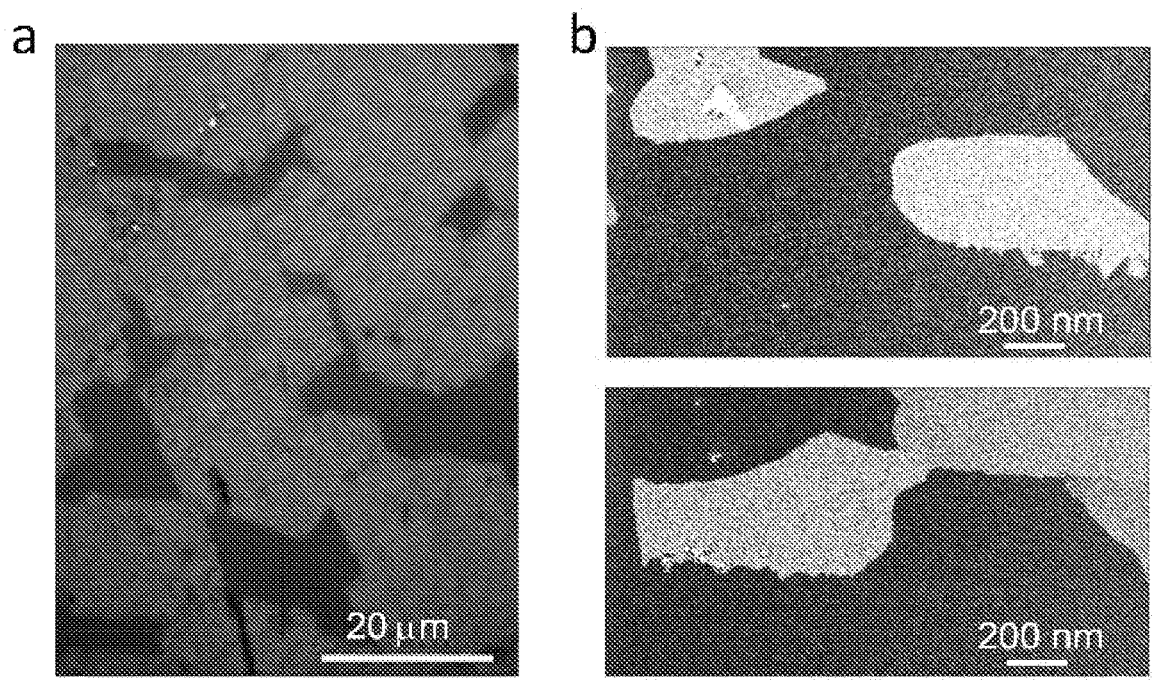
FIG. 7. Optical micrograph of a nearly continuous graphene film transferred to a Si/SiO$_2$ substrate showing a typical graphene grain size of about 20 μm (a). DF-TEM image of individual MoS$_2$ grains (b). The grain size for MoS$_2$ ranges from 500 nm to 1 μm.

Graphene growth: Copper foil (Nilaco Corporation, # CU-113213, 99.9% purity) was placed in a quartz boat and annealed in a 1 inch quartz tube hot wall furnace for 4 hours under hydrogen flow of 137 sccm at 1040° C. Then diluted methane (1%, balanced with hydrogen) was introduced to the furnace under the flow rate of 4.5 sccm for one hour to grow a continuous graphene film (partially grown graphene can be obtained by reducing the growth time). The furnace was cooled down to room temperature with hydrogen flowing after the growth was complete. FIG. 7a shows an optical micrograph of a nearly continuous graphene film transferred to a Si/$SiO_2$ used to measure the typical graphene grain size of approximately 20 μm.

Graphene transfer: The as-grown graphene on the Cu substrate was spin coated with PMMA A4 at 3000 RPM for one minute followed by etching in Cu etchant (CE-200, Transene Company INC). The resulting film was sequentially rinsed in DI water for 15 minutes, 4% HCl for one minute, and DI water for one minute. The film was then transferred to a $SiO_2$/Si substrate and baked at 170° C. until it was completely dried. After that, the substrate was soaked in hot acetone (90° C.) to remove PMMA. Finally the substrate was annealed in an ultra-high vacuum ($10^{-7}$ Torr) furnace at 350° C. for 5 hours to increase the adhesion between the graphene and the substrate and to further remove any polymer residues.

Graphene patterning: After being placed on the $SiO_2$/Si substrate, the graphene was patterned using photolithography and plasma etching. Briefly, positive photoresist S1805 (MicroChem) was spin coated on the substrate at 3000 RPM for one minute followed by baking at 115° C. for one minute. A contact aligner was used to expose the pattern using 365 nm light for 3 seconds. Then the pattern was developed using MIF 726 developer (MicroChem) for one minute and rinsed by isopropyl alcohol. The exposed graphene region was etched away using an oxygen plasma.

TMD growth: The substrate with patterned graphene was placed on a quartz plate and inserted into TMD growth furnace. The synthesis of monolayer TMD was carried out in a hot-wall quartz tube furnace with 4.3 inch inner diameter. Molybdenum hexacarbonyl ($Mo(CO)_6$, MHC, Sigma Aldrich 577766), tungsten hexacarbonyl ($W(CO)_6$, THC, Sigma Aldrich 472956) and diethyl sulfide ($C_4H_{10}S$, DES, Sigma Aldrich 107247) were the chemical precursors for Mo, W, and S, respectively. The growth was performed at 500° C. for 30 hours. The flow rate of precursors, regulated by individual mass flow controllers, were 0.01 sccm for MHC or THC, 0.3 sccm for DES, 1 sccm for Hz, and 150 sccm for Ar. NaCl was loaded as a desiccant in the upstream region to dehydrate the growth chamber. FIG. 7b shows a dark-field transmission electron microscopy (DF-TEM) image of individual $MoS_2$ grains that range from 500 nm to 1 μm in size.

Figure 8:
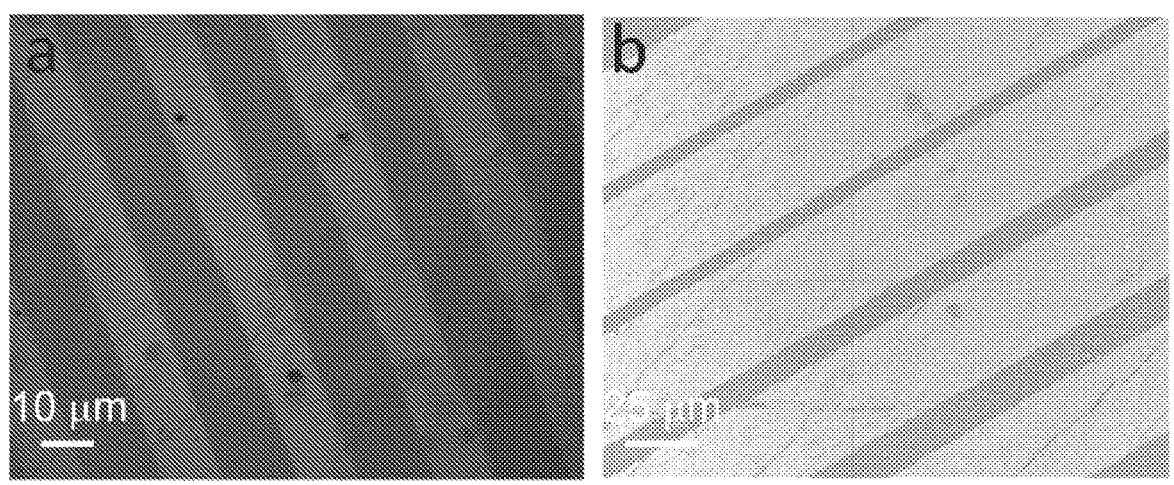
FIG. 8. Optical micrograph showing a heterostructure film grown under optimized conditions (a). Lighter: graphene, Darker: MoS$_2$. (b) is an SEM image of the heterostructure film. Light: graphene. Dark: MoS$_2$.

Desirable conditions: To create laterally-stitched graphene/TMD heterostructures we use the conditions as described above. One parameter is the pressure of the chamber containing the Mo or W precursor (MHC or THC). We found that improved conditions are obtained in a steady flow with the internal pressure of the precursor vessel=0.53 PSI, resulting in a partial pressure below 0.7 mTorr. The resulting film obtained using these parameters is homogenous without multilayer TMDs or overlapped junctions as shown in FIG. 8. For improved conditions, the precursor internal pressure can be from 0 psi to 0.53 psi (e.g., from 0.01 psi to 0.53 psi) and partial pressure can be from 0 mTorr to 0.7 mTorr (e.g., from 0.01 mTorr to 0.7 mTorr), including all values to the 0.01 therebetween.

Figure 9:
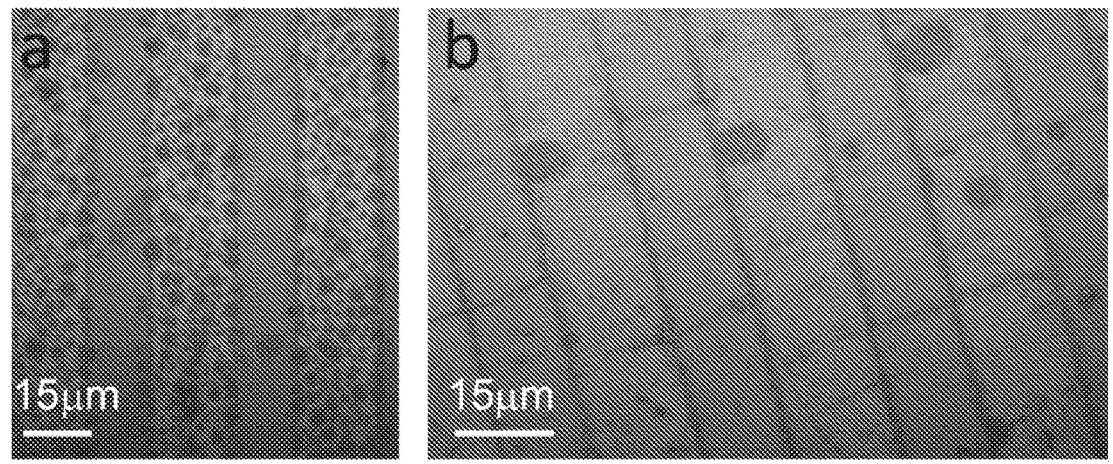
FIG. 9. Optical micrograph showing the nucleation at the initial stage when the TMD growth is performed under non-optimized growth conditions (a). Optical micrograph showing the resulting heterostructure film after the growth is complete using non-optimized growth conditions (b).

Increasing precursor pressure: With an increase of the pressure in the precursor chamber, the resulting film becomes non-homogenous with multilayer TMDs and with TMD nucleation observed on graphene surface. We consistently found overgrowth of the TMD layer and TMD nucleation on graphene for partial pressures of the metal precursor above 1 mTorr (FIG. 9).

Figure 10:
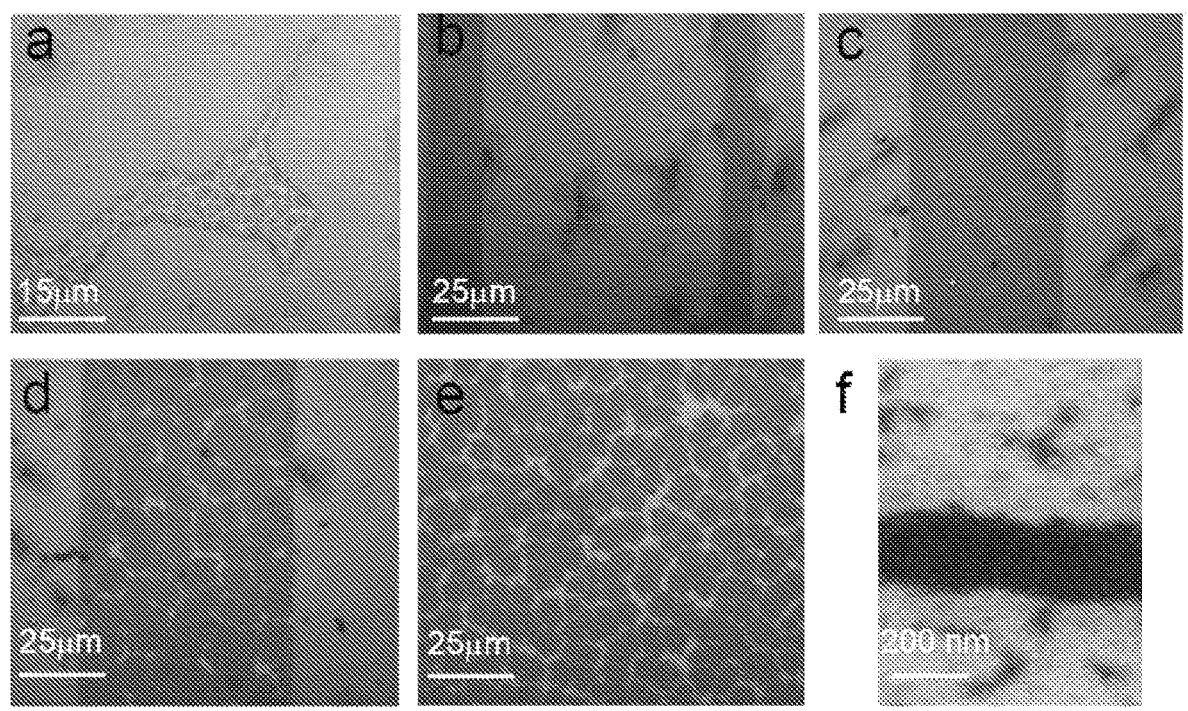
FIG. 10. Optical micrograph of a heterostructure film grown using non-continuous graphene at the initial growth stage, showing a graphene edge covered by MoS$_2$ grains (a). (b), (c), and (d) are the optical images showing coverage of the MoS$_2$ channel between graphene stripes with different channel length. (e) is an optical image of the same substrate as (b), (c) and (d) showing coverage of the MoS$_2$ for a region containing no graphene stripes. (f) is an SEM image of a 200 nm WS$_2$ channel in between two graphene stripes.

TMD nucleation: TMD nucleation occurs at the graphene edge during the initial growth stage. We observed that the graphene edge becomes fully covered by $MoS_2$ early in the growth (FIG. 10). For a patterned heterostructure growth, for samples with a greater distance between the graphene stripes the average coverage of $MoS_2$ is decreased, indicating that the nucleation of $MoS_2$ occurs preferentially at graphene edges. This can be explained by a diffusion of the precursors off of the graphene film and onto the $SiO_2$ surface.

To explore the possibility of miniaturization of our devices we have fabricated lateral heterostructures with channel lengths as small as 200 nm (FIG. 10f). To obtain such small scale channels, the growth conditions had to be selected (reduction of the growth time).

2: Photoluminescence and Raman Scattering

Figure 11:
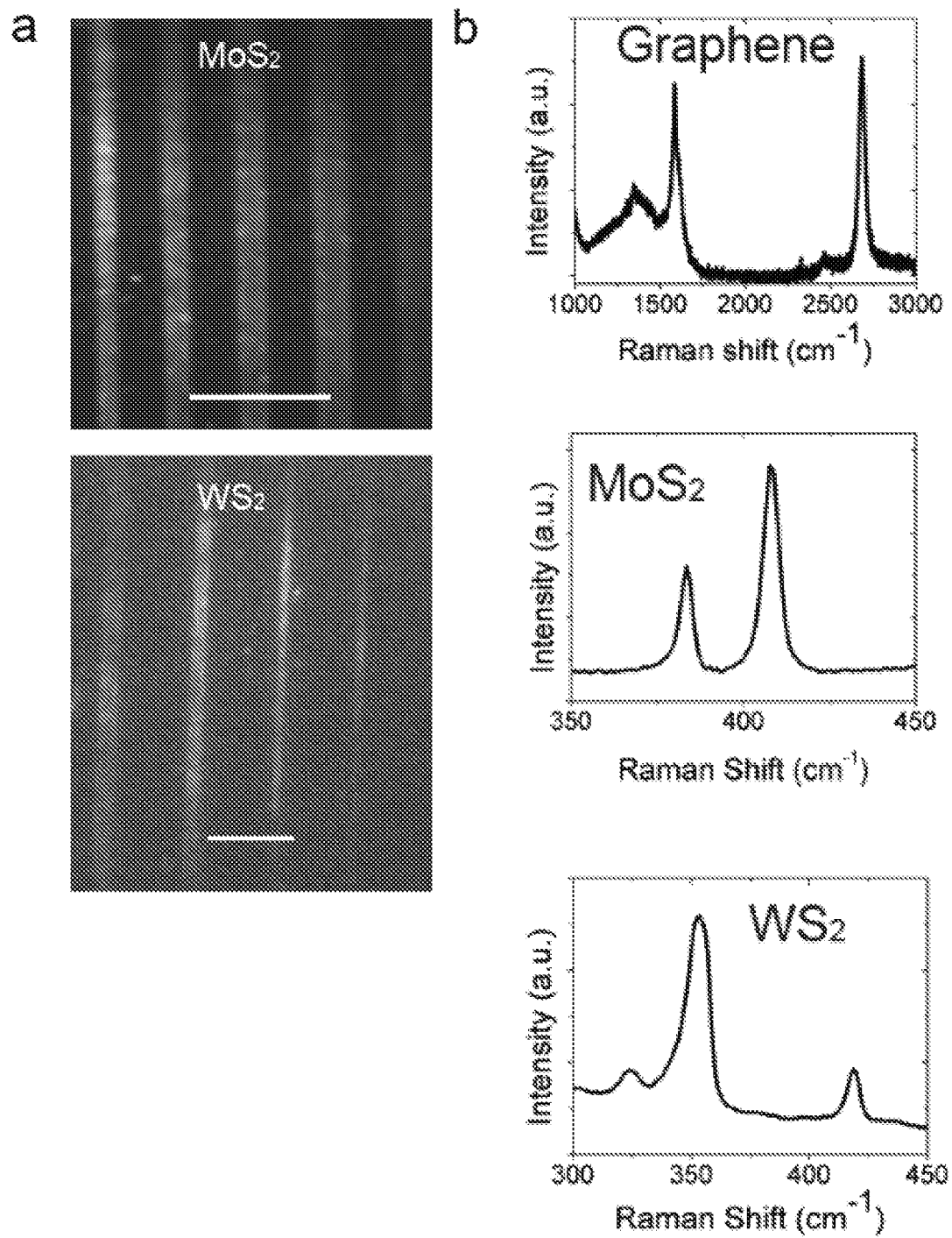
FIG. 11. Photoluminescence (PL) intensity mapping is shown in (a) for MoS$_2$ or WS$_2$ on MoS$_2$/graphene (top) and WS$_2$/graphene (bottom) heterostructure films. Bright regions correspond to high intensity. The scale bar is 50 μm. (b) is a Raman spectra for graphene (top), MoS$_2$ (middle) and WS$_2$ (bottom) on the heterostructure film.

Photoluminescence: Photoluminescence (PL) measurements were performed under ambient conditions using a laboratory-built apparatus with a 532 nm excitation laser (FIG. 11a). The spectra were obtained by a spectrometer with a CCD camera and the images were directly taken using band pass filter.

Raman: Raman spectra (FIG. 11b) were taken under ambient conditions with a 532 nm excitation laser.

3: Additional DF-TEM Images

TEM Sample preparation: A monolayer heterostructure film grown on a $SiO_2$/Si substrate was spin coated with PMMA A2 at 4000 RPM for one minute. Then the substrate was etched in 1M KOH solution at 60° C. until the film is delaminated from the substrate. The film was rinsed in deionized water three times before being transferred to a TEM grid. The chip was then annealed in an ultra-high vacuum ($10^{-7}$ Torr) furnace at 350° C. for 5 hours to remove the PMMA.

Figure 12:
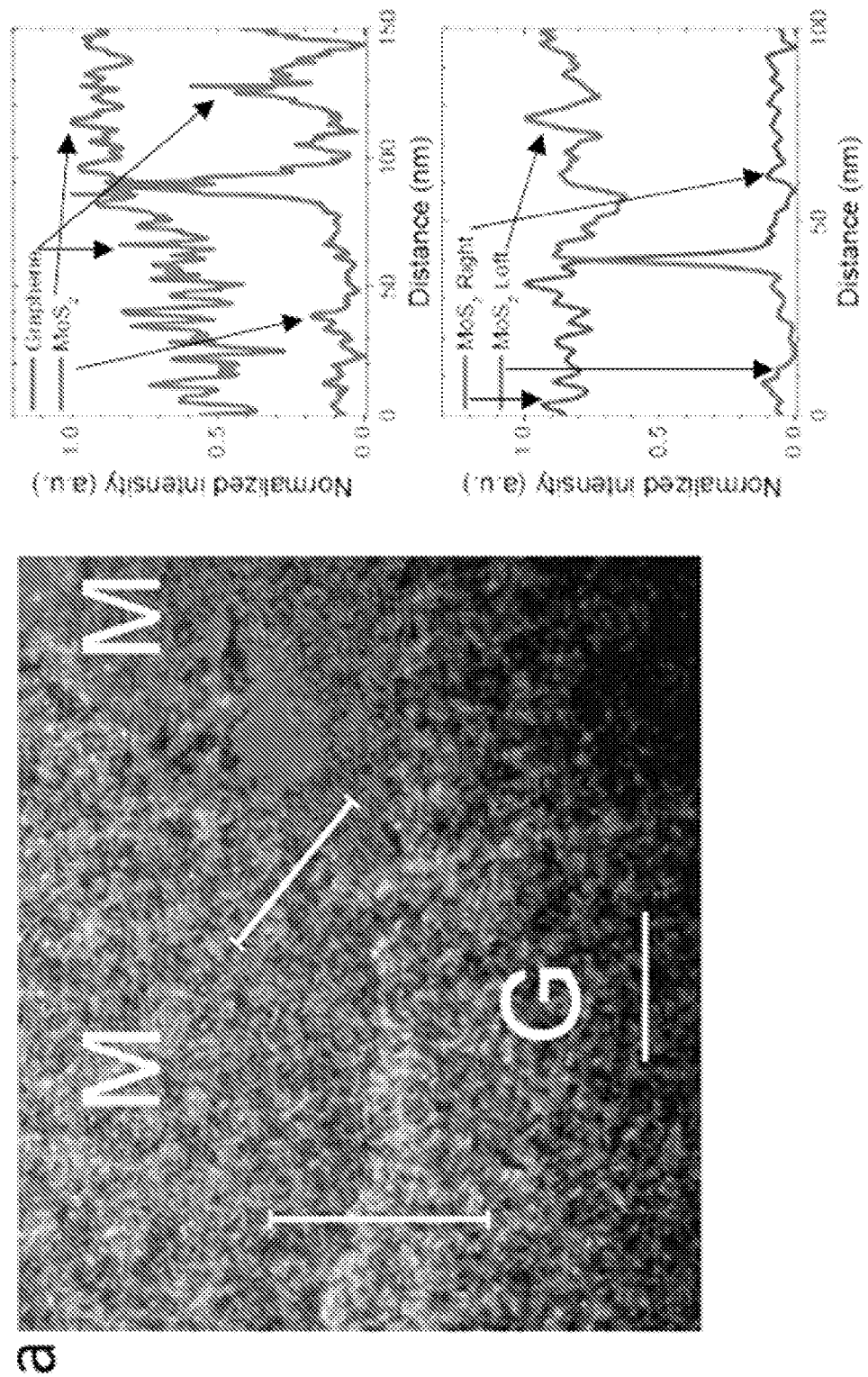
FIG. 12. DF-TEM images taken from three different samples showing no overlapped junctions within the resolution of the TEM. The scale bars are 100 nm. M=MoS$_2$, G=Graphene. (a) Left: DF-TEM image of a graphene/MoS$_2$ junction. Right: Line profiles taken at a boundary between graphene and MoS$_2$ and at a boundary between two different MoS$_2$ grains. (b) Individual DF-TEM images used to obtain the colored image shown in (a). Two additional images from different randomly selected junctions are shown in (c) and (d).
Figure 12:
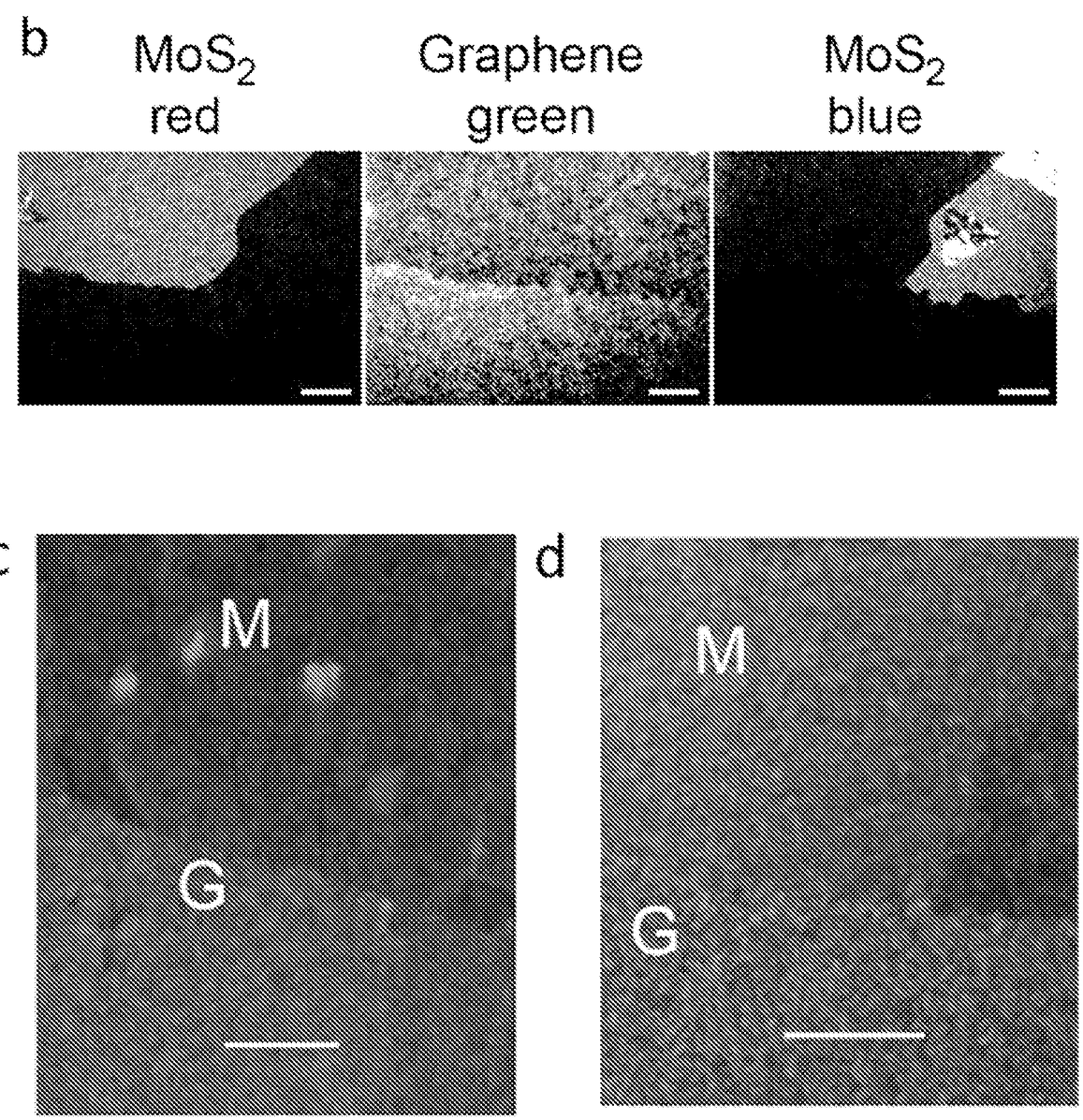

DF-TEM: DF-TEM images with the corresponding electron diffraction patterns were taken using an FEI Tecnai T12 Spirit TEM operating at 80 keV. The line profiles in FIG. 12a were determined using an averaging window 15 nm in width. We can extract the resolution of our DF-TEM images (~8 nm) from such profiles by the change in intensity at the edge of different $MoS_2$ and graphene grains. We observe that the transitions between graphene and $MoS_2$ and between different $MoS_2$ grains show the same resolution-limited abruptness, indicating lateral stitching of the $MoS_2$ and graphene.

4: Additional TEM Studies

Figure 13:
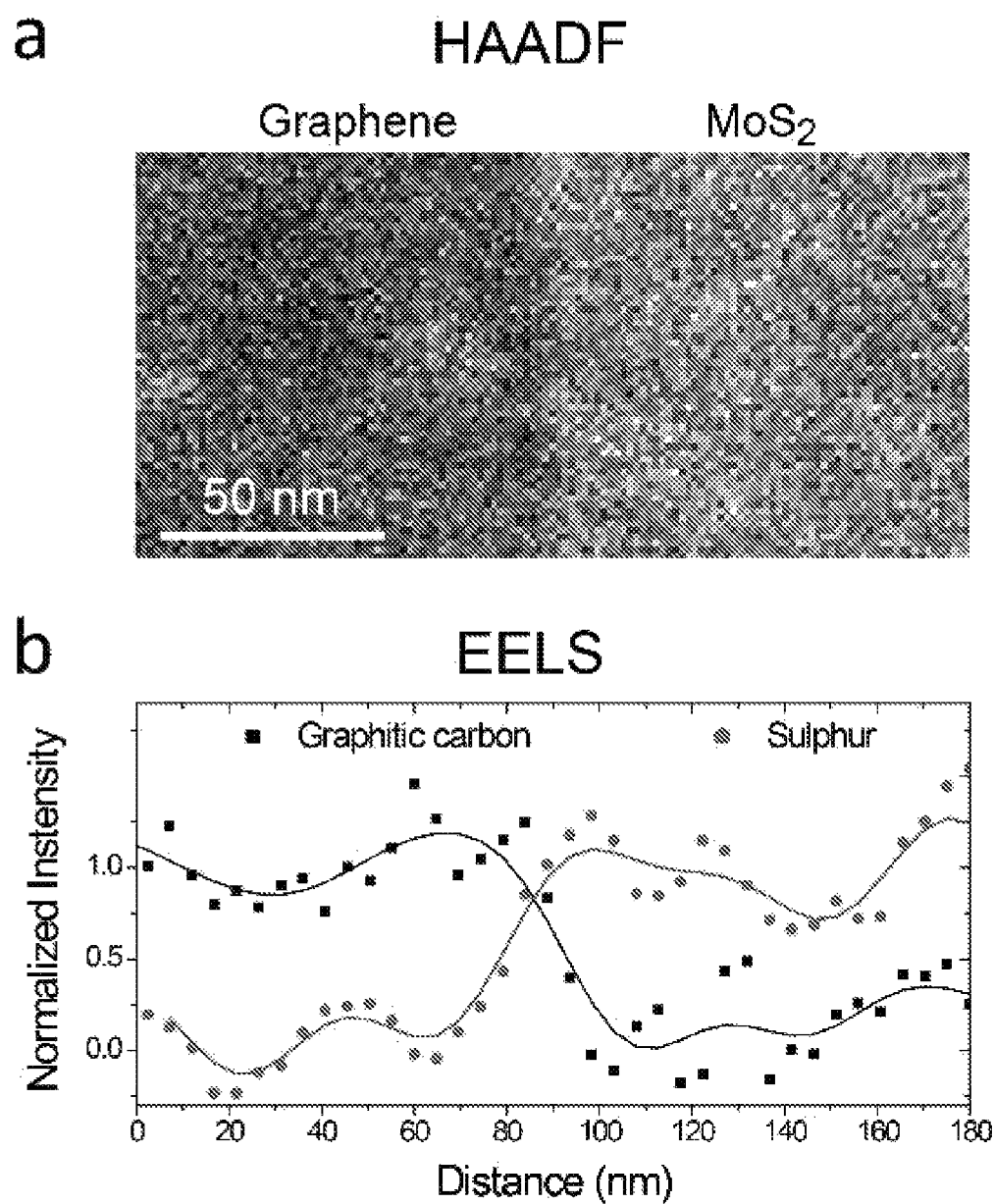
FIG. 13. HAADF image of a graphene/MoS$_2$ junction (a). Low atomic number (graphene) is shown in dark and high atomic number (MoS$_2$) is shown in bright contrast. (b) Normalized line profile for the integrated graphitic carbon peak (squares) and the Sulphur peak (circles) obtained by EELS for the same region shown in (a).

In addition to DF-TEM imaging we also performed high-angle annular dark-field (HAADF) image and electron energy loss spectroscopy (EELS) analysis of a graphene/$MoS_2$ junction. FIG. 13a shows the HAADF image, which is highly sensitive to the atomic and shows heavier elements in bright contrast. We observe a sharp transition in the HAADF contrast at the junction.

A similar abrupt transition is observed in the chemical analysis extracted by EELS (FIG. 13b). In order to improve the signal-to-noise ratio of the EELS line profile, we averaged 22 spectra over 80 nm parallel to the junction.

5: Device Fabrication

We start our device fabrication by transferring chemical-vapor-deposition (CVD) grown graphene onto a heavily doped Si substrate with a thin (300 nm) $SiO_2$ layer to be used as back gate electrode and dielectric. The graphene is then patterned into stripes by optical lithography and oxygen plasma etching using a reactive ion etching (RIE) tool. The desired TMD ($MoS_2$ or $WS_2$) is grown using the desirable conditions described above in order to avoid overlapped regions between the graphene and the TMD.

To contact the graphene (or TMD) sheet, Ti/Au (5/50 nm) metal electrodes are fabricated using conventional optical and electron beam lithography methods followed by metal deposition using an electron beam evaporator at high vacuum ($10^{-7}$ Torr). The lift-off step is done by soaking the chip in acetone for several (>5) hours and rinsing with isopropyl alcohol. The conducting channel is defined by subsequent lithography and RIE steps. For the top gate dielectric we deposit an Al layer (1 nm) to be used as a seeding layer for $HfO_2$ deposited by atomic layer deposition (30-60 nm). The top gate electrode is defined by an optical lithography step followed by metal deposition (Ti/Au 5/50 nm) in an electron beam evaporator.

6: 2-Probe Mobility as a Function of Channel Length for 1DG Contacts

Figure 14:
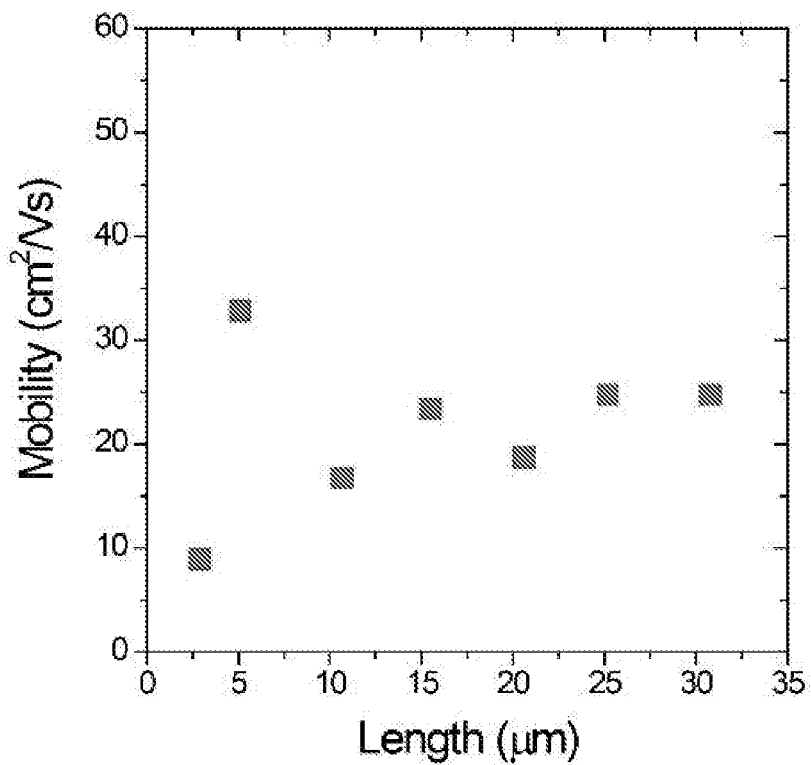
FIG. 14. Room temperature 2-probe field-effect mobility as a function of channel length for MoS$_2$-based devices with 1DG contacts.

FIG. 14 shows the 2-probe field-effect mobility as a function of the channel length for $MoS_2$-based devices with 1DG contacts at room temperature. We observe mobilities between 10 and 30 cm²/Vs.

7: Contact Resistance from 4-Probe Measurements

Figure 15:
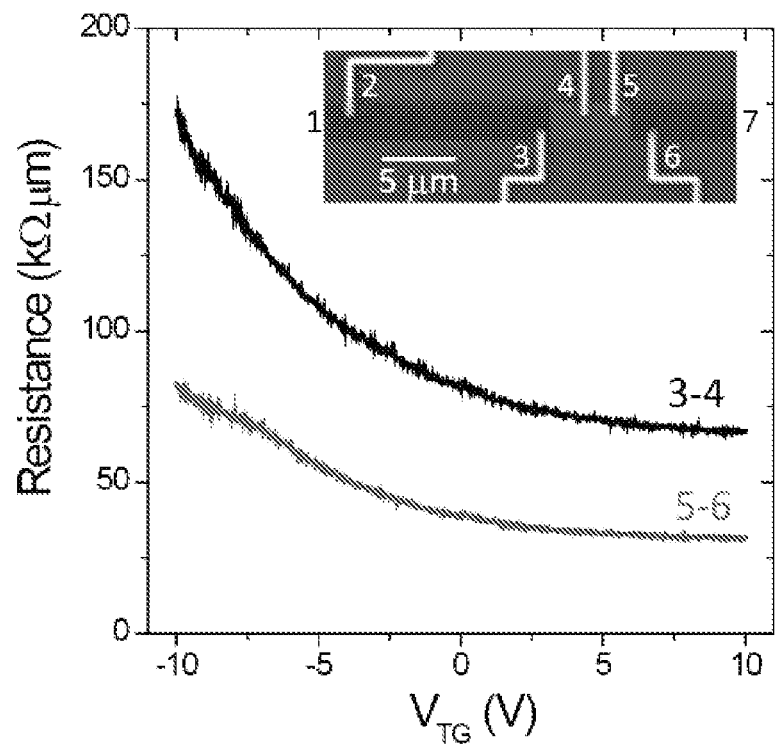
FIG. 15. As-measured resistance (R$_{34}$ and R$_{56}$) for the junctions in between electrodes 3 and 4 and between electrodes 5 and 6 as a function of the top gate voltage ($V_{TG}$). Inset: Optical micrograph of the device indicating the current electrodes (1 and 7, outside the field of view), and several voltage probes, numbered 2 to 6.
Figure 16:
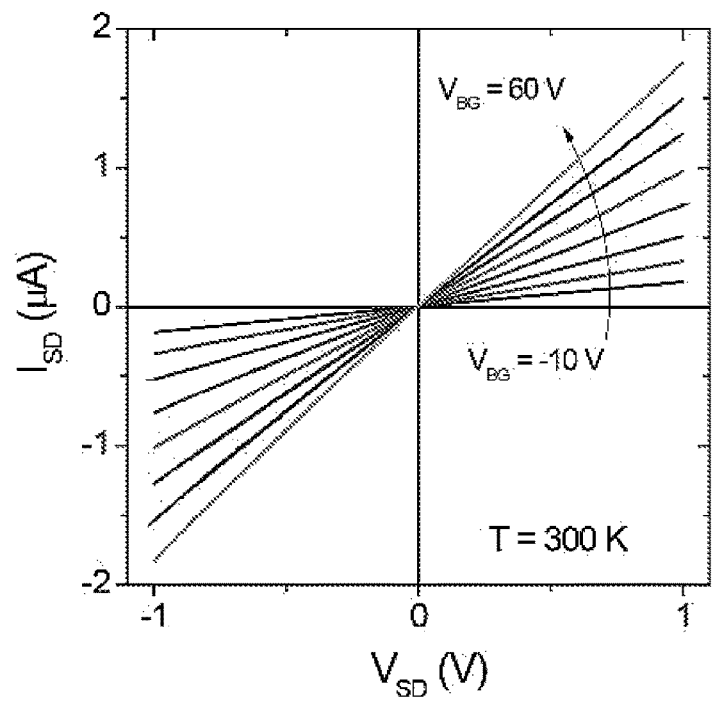
FIG. 16. Source-drain current ($I_{SD}$) versus voltage ($V_{SD}$) for different values of back gate voltage ($V_{BG}$) at 300 K for low doping (n<3×10$^{12}$ cm$^{-2}$).
Figure 17:
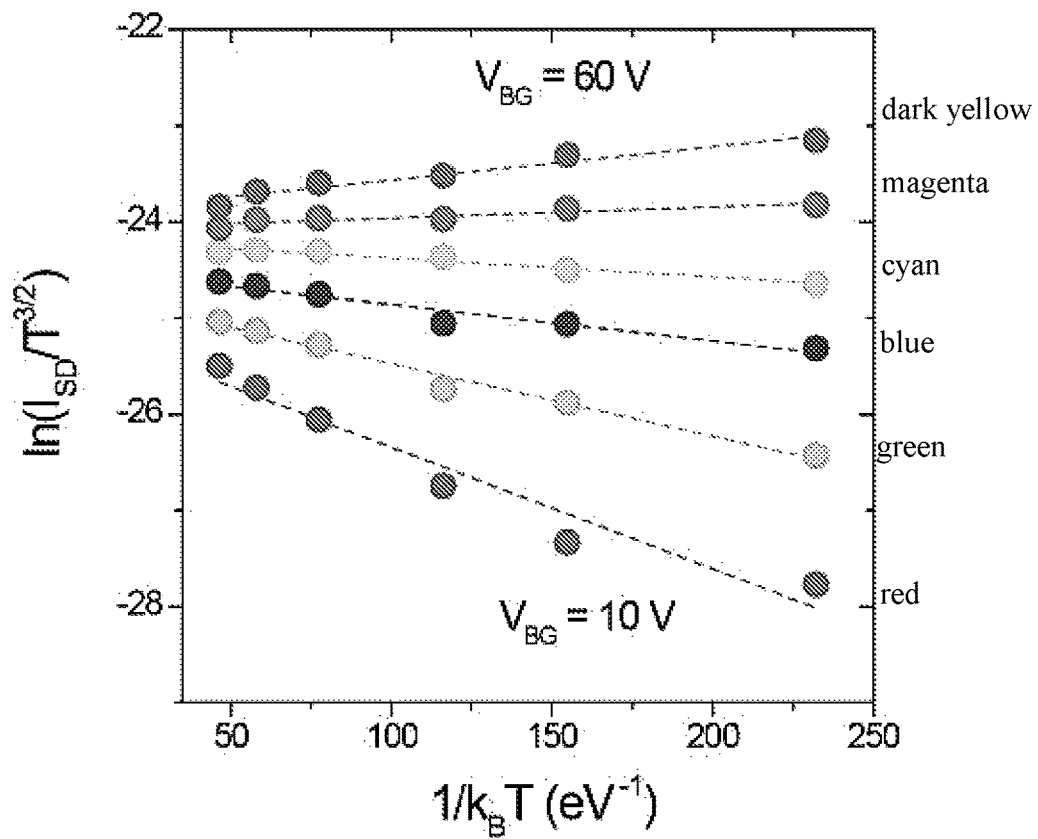
FIG. 17. Arrhenius plot used to extract the barrier height in FIG. 5b (main text). Different colors represent different values of $V_{BG}$, from bottom to top: 10 V (red), 20 V (green), 30 V (blue), 40 V (cyan), 50 V (magenta), and 60 V (dark yellow). The dots represent the experimental data points and the dashed lines are line fits used to extract the Schottky barrier height.
Figure 18:
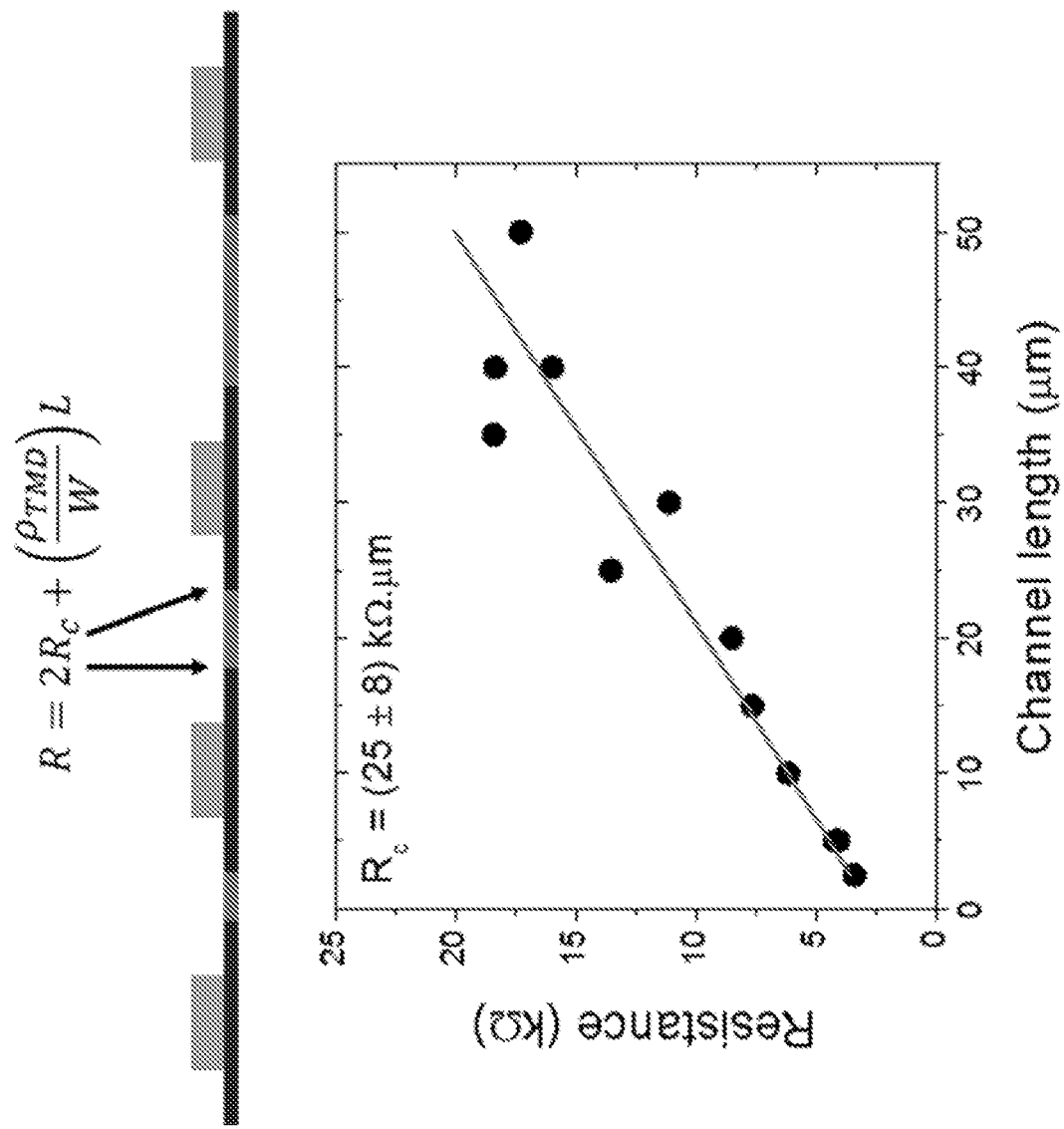
FIG. 18. Transfer length measurements.
Figure 19:
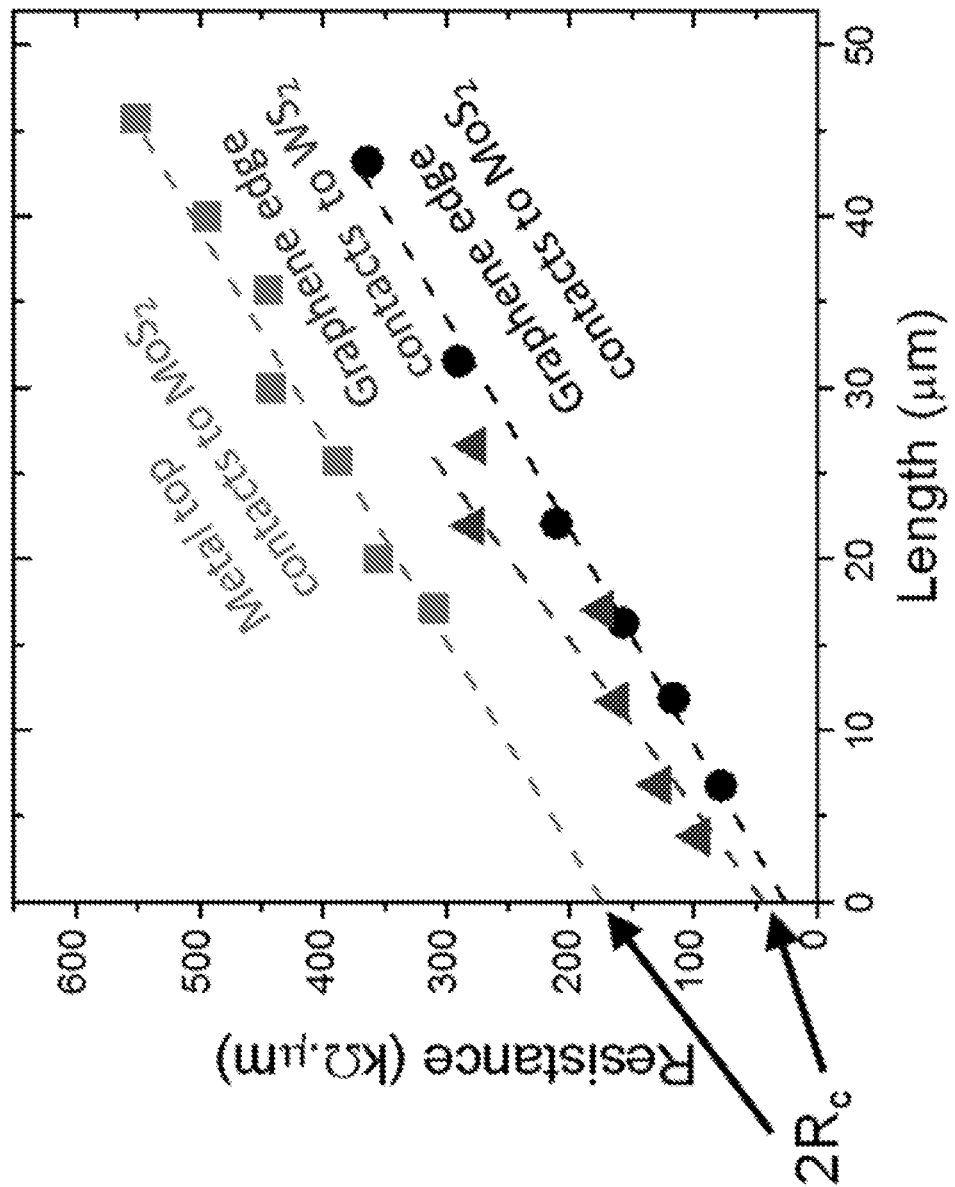
FIG. 19. A comparison to top contacts and WS$_2$.
Figure 20:
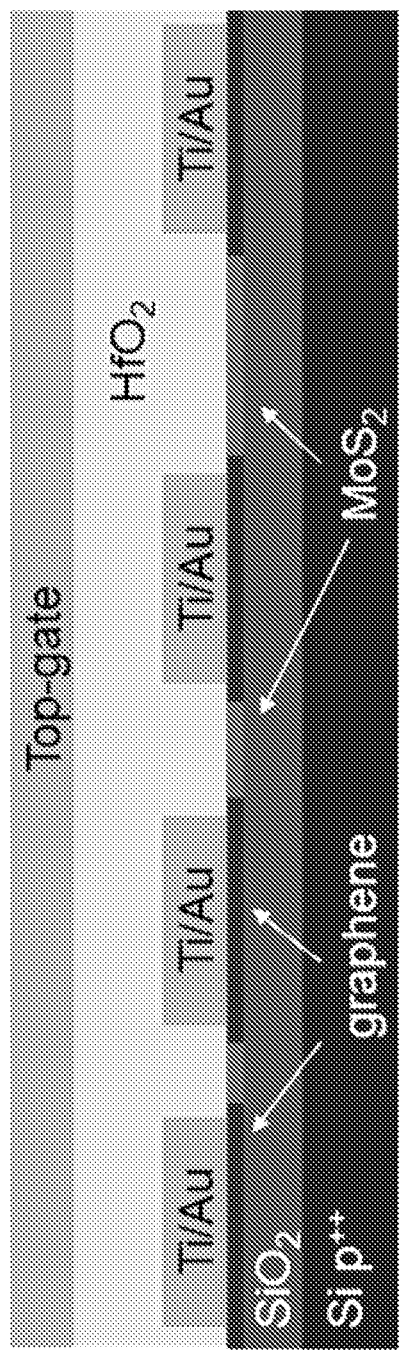
FIG. 20. A side view of an exemplary device.
Figure 21:
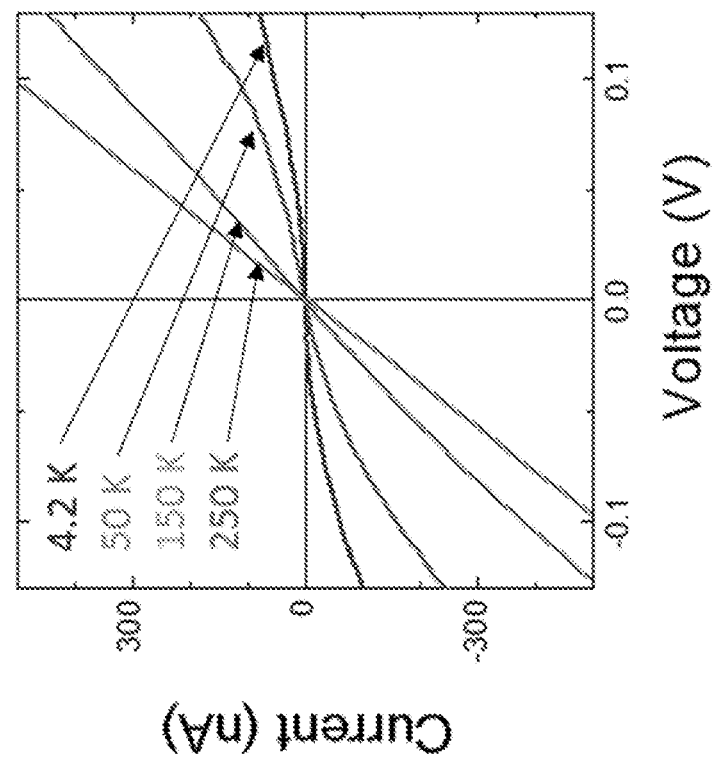
FIG. 21. Data at low carrier density.
Figure 21:
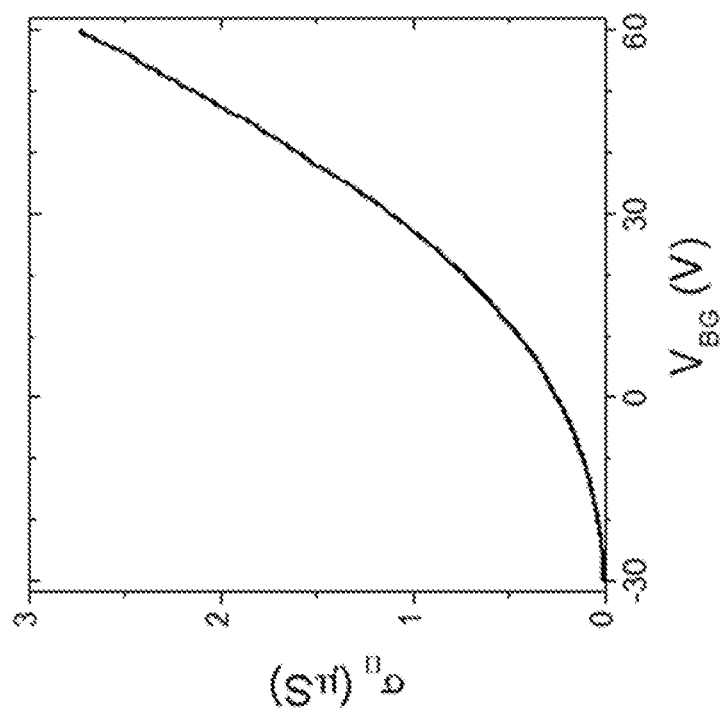

For the 4-probe measurements of the graphene/TMD contact resistance, we drive a current $I_{17}$=100-200 nA between two electrodes (1 and 7, out of the field of view in FIG. 15) and measure the voltage between all the other adjacent contacts simultaneously ($V_{23}$, $V_{34}$, $V_{45}$, $V_{56}$). The sheet resistance for graphene is given by:

$$R_g = \frac{V_{23}}{I_{17}} \frac{W}{L_{23}},$$

where W=2.37 μm is the channel width, and $L_{23}$=12.37 μm is the distance between electrodes 2 and 3. Analogously, the sheet resistance for $MoS_2$ is given by:

$$R_{MoS2} = \frac{V_{45}}{I_{17}} \frac{W}{L_{45}},$$

where $L_{45}$=2.02 μm.

The resistance across a particular junction, e.g. between electrodes 5 and 6, can be described as:

$$R_{56} = \frac{V_{56}}{I_{17}} = R_g\left(\frac{L_g^{56}}{W}\right) + R_c + R_{MoS2}\left(\frac{L_{MoS2}^{56}}{W}\right),$$

where $L_g^{56}$ is the length of the graphene region between electrodes 5 and 6, $R_c$ is the contact resistance between the graphene and the $MoS_2$, and $L_{MoS2}^{56}$ is the length of the $MoS_2$ region between electrodes 5 and 6. Both $L_g^{56}$ and $L_{MoS2}^{56}$ are obtained from the optical image shown in the inset of FIG. 15. Finally, the value for $R_c$ is obtained by subtracting the graphene and $MoS_2$ contributions to $R_{56}$.

8: IV Curves for Low Carrier Density at Room Temperature

The IV characteristics of the 1DG contacts are linear at room temperature for a wide range of $V_{BG}$ values. FIG. 14 shows a source-drain current versus voltage characteristics at 300 K for a sample containing two junctions in series for different values of $V_{BG}$.

9: Arrhenius Plots for Measurements of the Barrier Height

To extract the barrier height we performed temperature dependence measurements of the junction resistance to determine an activation energy. Assuming a thermo-ionic emission model, the source-drain current across the device is given by:

$$I_{SD} = AT^{3/2}\exp\left(\frac{-q\Phi_B}{k_B T}\right)\left[1 - \exp\left(\frac{qV_{SD}}{\eta k_B T}\right)\right],$$

where $I_{SD}$ is the source-drain current, A is the effective Richardson constant, T is the temperature, q is the elementary charge, $k_B$ is the Boltzmann constant, $V_{SD}$=50-100 mV is the source-drain bias, and η is the ideality factor. The ideality factor is related with tunneling at high carrier concentration at low temperatures and was obtained from a plot of the logarithm of $I_{SD}$ as a function of $V_{SD}$ at 4.2 K. The barrier height is obtained from the slope of the plot of $$\ln\left(\frac{I_{SD}}{T^{3/2}}\right)$$

versus $1/k_B T$ (Arrhenius plot). The slope is given by: $-q\Phi_B + qV_{SD}/\eta$.

Although the present disclosure has been described with respect to one or more particular embodiments, it will be understood that other embodiments of the present disclosure may be made without departing from the scope of the present disclosure. Hence, the present disclosure is deemed limited only by the appended claims and the reasonable interpretation thereof.

The invention claimed is:

1. An apparatus comprising:
   a substrate;
   a monolayer graphene film disposed on at least a portion of the substrate; and
   a single-layer transition metal dichalcogenide (TMD) disposed only on the substrate and lateral edges of the monolayer graphene film;
   wherein the monolayer graphene film and the single-layer TMD are laterally stitched.

2. The apparatus of claim 1, wherein the substrate includes at least one of $Al_2O_3$, $SiO_2$, or silicon.

3. The apparatus of claim 1, wherein the single-layer TMD includes at least one of $MoS_2$, $WS_2$, $MoSe_2$, $WSe_2$, $MoTe_2$, $WTe_2$, $NbSe_2$, or a combination thereof.

4. The apparatus of claim 1, wherein the interface between the monolayer graphene film and TMD exhibits a resistivity of 30 k$\Omega\mu$m or less.

5. The apparatus of claim 1, wherein no van der Waals gap or tunnel barrier exists between the monolayer graphene film and the single-layer TMD.

6. The apparatus of claim 1, wherein the monolayer graphene film and the single-layer TMD form a homogenous heterostructure.

7. The apparatus of claim 1, wherein a junction is formed between the monolayer graphene film and the single-layer TMD.

8. An electronic device comprising one or more apparatus of claim 1.

9. The apparatus of claim 1, wherein the monolayer graphene film and the single-layer TMD are laterally stitched with no visible overlap or gap therebetween.

10. A method comprising:
    forming a monolayer graphene film on a substrate; and
    forming a single-layer transition metal dichalcogenide (TMD) on the substrate that contacts one or more of the lateral edges of the monolayer graphene film, wherein the single-layer TMD is in contact with the substrate is laterally stitched to the monolayer graphene film at the lateral edges.

11. The method of claim 10, wherein the monolayer graphene film is formed by chemical vapor deposition on the substrate.

12. The method of claim 10, wherein the monolayer graphene film is formed by chemical vapor deposition and is transferred to the substrate.

13. The method of claim 10, wherein the single-layer TMD is grown by metal-organic chemical vapor deposition or molecular beam epitaxy.

14. The method of claim 13, wherein the single-layer TMD is grown at a PM below 0.7 mTorr.

15. The method of claim 10, further comprising fabricating a device, wherein the graphene film is configured to be used as one-dimensional edge contacts to the single-layer TMD.

16. The method of claim 10, wherein the monolayer graphene film and/or the single-layer TMD are grown at room temperature.

17. The method of claim 10, wherein the substrate includes at least one of $Al_2O_3$, $SiO_2$, or Si.

18. The method of claim 10, wherein the single-layer TMD includes at least one of $MoS_2$, $WS_2$, $MoSe_2$, $WSe_2$, $MoTe_2$, $WTe_2$, $NbSe_2$, or a combination thereof.

19. The method of claim 10, further comprising patterning the monolayer graphene film prior to growing the single-layer TMD.

20. The method of claim 10, further comprising forming electrodes on the monolayer graphene film and/or the single-layer TMD.

21. The method of claim 20, further comprising depositing an insulating material on at least one of the single layer TMD or the monolayer graphene film to form a top gate electrode.

22. The method of claim 10, wherein the monolayer graphene film and the single-layer TMD are laterally stitched with no visible overlap or gap therebetween.

23. The method of claim 10, wherein the single layer TMD is formed on the substrate without use of a seed molecule.

24. The method of claim 10, wherein the single layer TMD is formed only on an exposed SiO2 surface of the substrate and not on the monolayer graphene film, with the forming of the single-layer TMD comprises growing the TMD from the lateral edges of the monolayer graphene film.

* * * * *